(12) United States Patent
Teo

(10) Patent No.: US 11,638,376 B2
(45) Date of Patent: Apr. 25, 2023

(54) ELECTRONIC DEVICE HAVING SELF-ALIGNED CONTACTS

(71) Applicant: Applied Materials, Inc., Santa Clara, CA (US)

(72) Inventor: Russell Chin Yee Teo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/686,850

(22) Filed: Mar. 4, 2022

(65) Prior Publication Data

US 2022/0189965 A1 Jun. 16, 2022

Related U.S. Application Data

(62) Division of application No. 16/868,933, filed on May 7, 2020, now Pat. No. 11,302,699.

(60) Provisional application No. 62/851,093, filed on May 21, 2019.

(51) Int. Cl.
H01L 21/768 (2006.01)

(52) U.S. Cl.
CPC ..... *H10B 12/485* (2023.02); *H01L 21/76897* (2013.01); *H10B 12/34* (2023.02)

(58) Field of Classification Search
CPC .. H01L 21/76897; H01L 12/485; H10B 12/34
USPC .................................. 257/621, 905
See application file for complete search history.

(56) References Cited

U.S. PATENT DOCUMENTS

| | | |
|---|---|---|
| 9,887,127 B1 | 2/2018 | Licausi et al. |
| 10,607,998 B1 * | 3/2020 | Iwaki .................. H10B 12/315 |
| 2017/0372960 A1 | 12/2017 | Mebarki et al. |

* cited by examiner

*Primary Examiner* — Hoai V Pham
(74) *Attorney, Agent, or Firm* — Servilla Whitney LLC

(57) ABSTRACT

Electronic devices and methods of forming electronic devices using a reduced number of hardmask materials and reusing lithography reticles are described. Patterned substrates are formed using a combination of etch selective hardmask materials and reusing reticles to provide a pattern of repeating trapezoidal and rhomboidal openings.

9 Claims, 38 Drawing Sheets

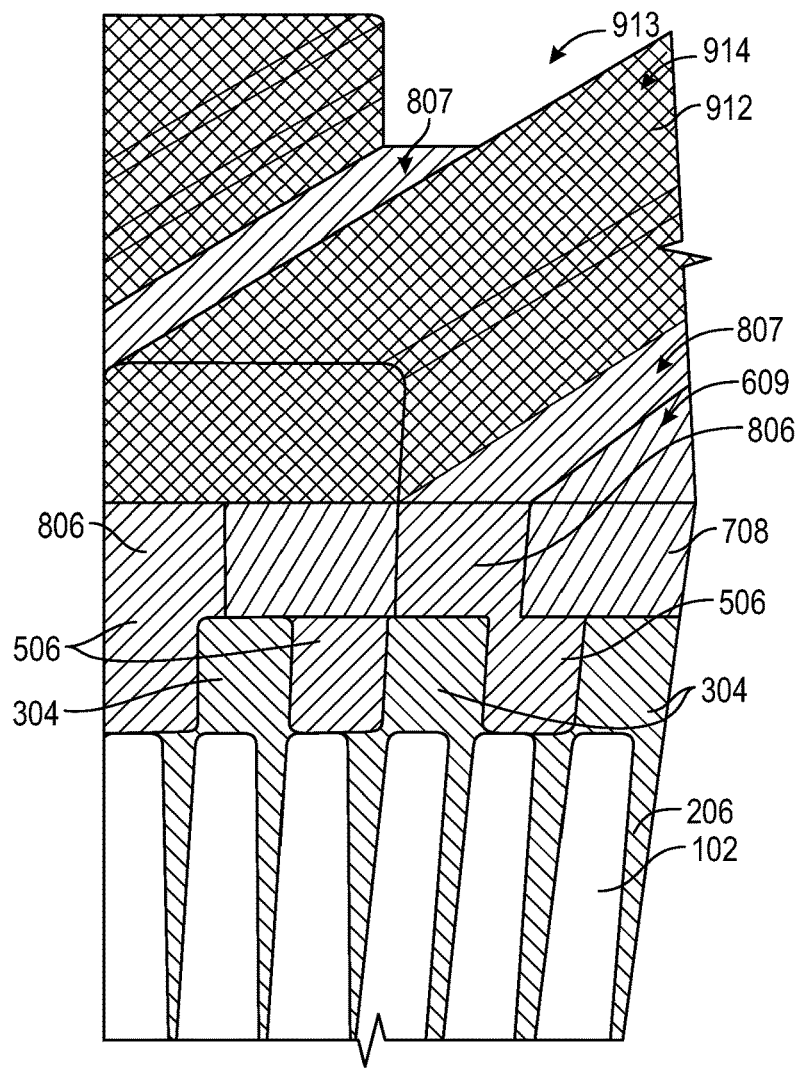
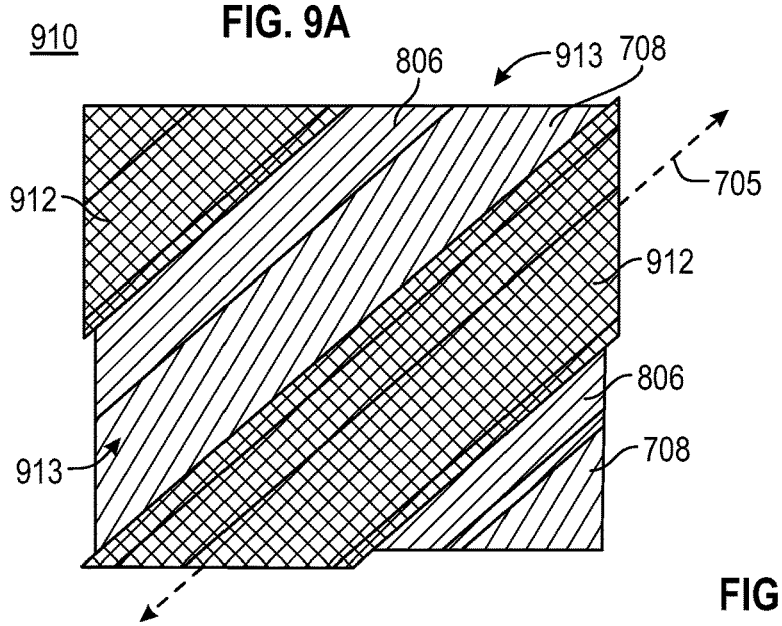
FIG. 9A
FIG. 9B

1700

1710

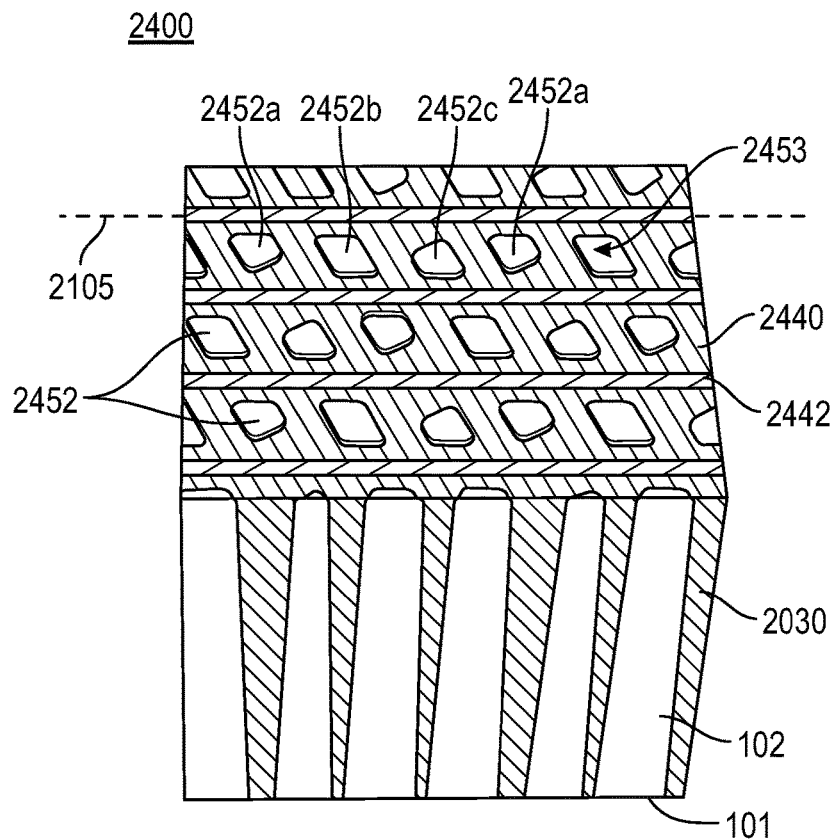
FIG. 24A
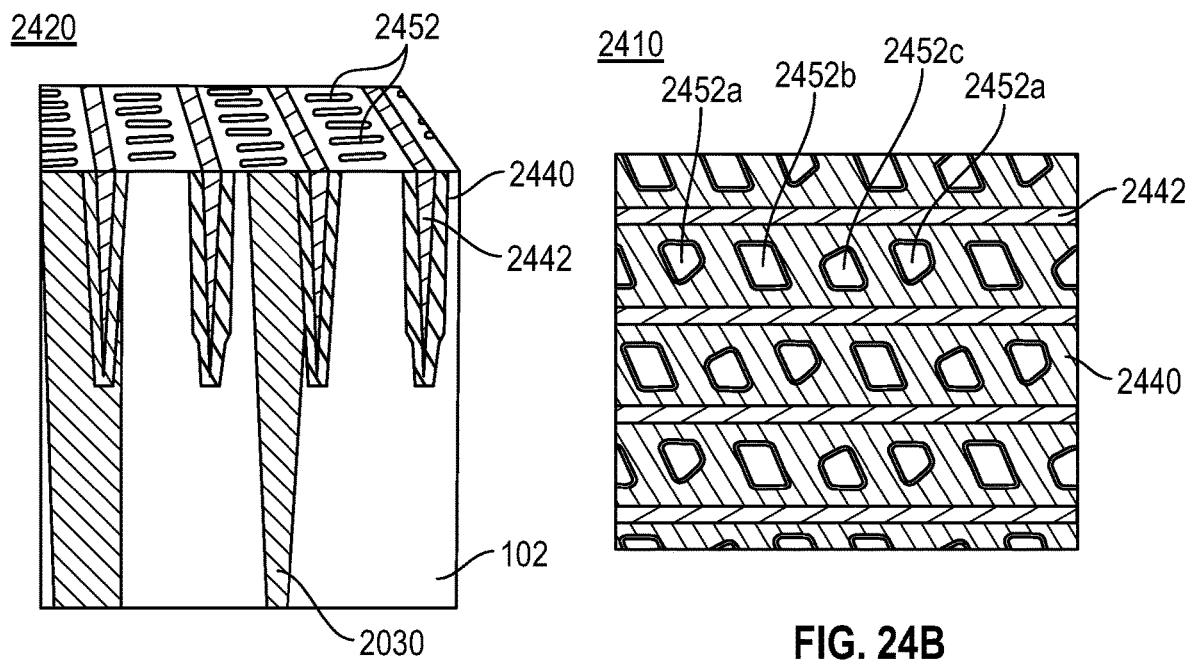
FIG. 24C
FIG. 24B

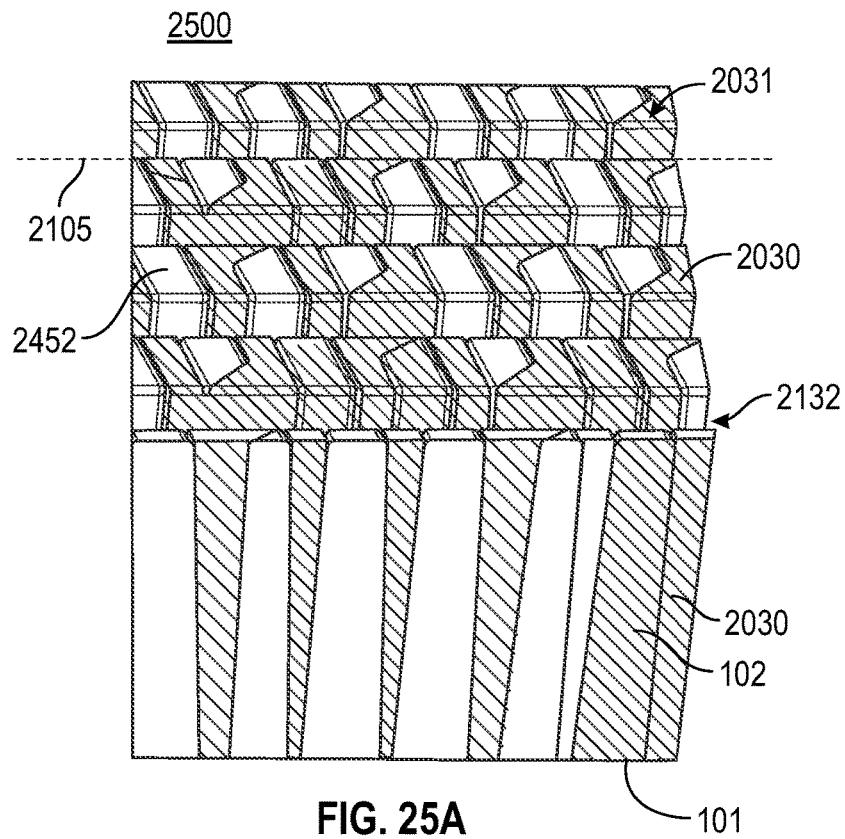
FIG. 25A
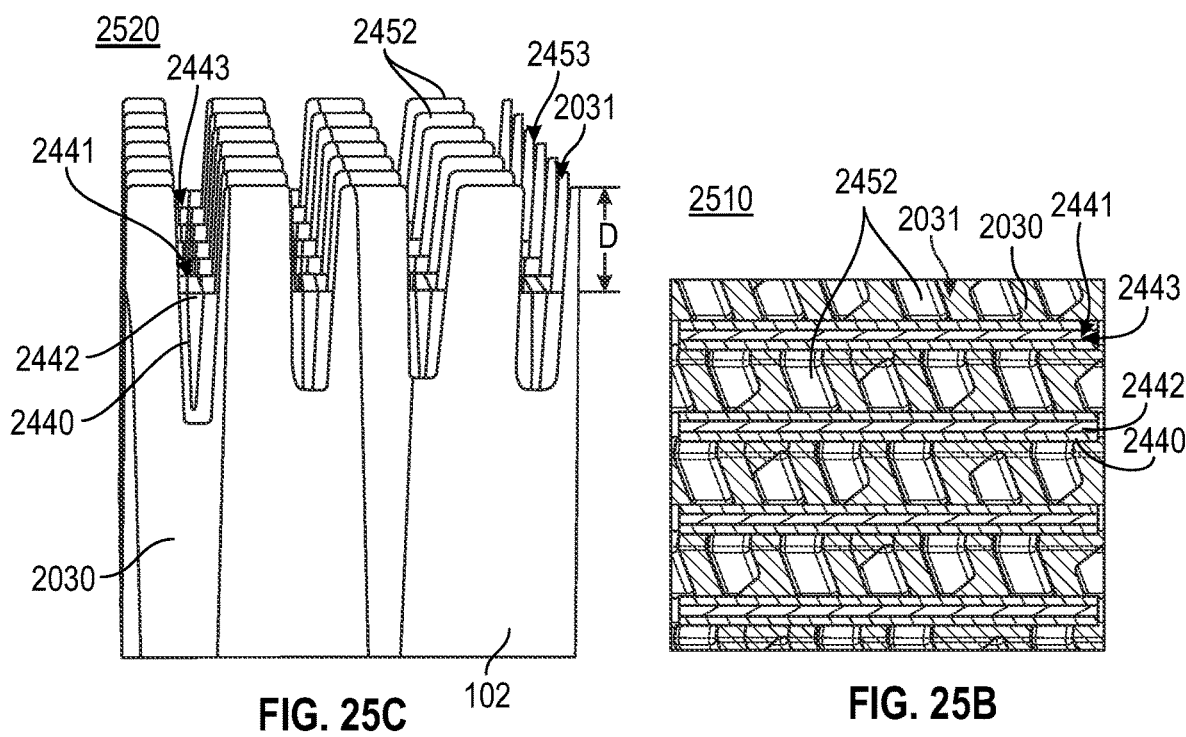
FIG. 25C
FIG. 25B

ELECTRONIC DEVICE HAVING SELF-ALIGNED CONTACTS

CROSS-REFERENCE TO RELATED APPLICATIONS

This application is a divisional of U.S. application Ser. No. 16/868,933, filed May 7, 2020, which claims priority to U.S. Provisional Application No. 62/851,093, filed May 21, 2019, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of producing self-aligned bit-line-contacts (BLC).

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases and misalignment of contact becomes less tolerable. Conventional processes for dynamic random access memory (DRAM) bit-line-contact (BLC) layers use a Lithography-Etch-Lithography-Etch (LELE) patterning scheme. The LELE scheme has strict edge placement error (EPE) requirements on DRAM manufacturers to correctly land BLC on the Active material. Slight misalignments of the contacts can cause shorting between adjacent memory cells.

Accordingly, there is a need in the art for methods of forming bit line contacts with decreased edge placement errors.

SUMMARY

One or more embodiments of the disclosure are directed to electronic devices comprising: a plurality of spaced wordlines defining a third direction, each of the wordlines spaced from adjacent wordlines by a dielectric; and a plurality of substrate islands within the dielectric between the wordlines, the substrate islands extending in a first direction, second direction and third direction, the substrate islands comprising trapezoid-like shaped islands (TI), right-facing rhombus-like islands (RFI) and left-facing rhombus-like islands (LFI) arranged in repeating patterns along the first direction, the second direction and the third direction, the first direction and the third direction, the islands form a repeating pattern of TI, RFI and LFI, along the second direction, the islands appearing as a line of single type to have a line of TI, a line of RFI and a line of LFI.

Additional embodiments are directed to methods of forming an electronic device comprising reusing hardmask materials and lithography reticles.

One or more embodiments are directed to method of forming an electronic device. In one or more embodiments, a method of forming an electronic device comprises: forming a set of first lines, the set of first lines having a top surface and spaced to form a recess; forming a dielectric layer, a portion of the dielectric layer filling the recess; planarizing a top surface of the dielectric layer; selectively patterning the dielectric layer to form a first hardmask, the first hardmask having a first hardmask top surface and plurality of trenches exposing the top surface of the set of first lines; patterning the first hardmask; forming a second hardmask, the second hardmask having raised portions and lower portions; planarizing to exposing an alternating pattern of first hardmask and second hardmask; forming and patterning a third hardmask, the patterned third hardmask having a top surface and a plurality of channels formed therein; forming and patterning a fourth hardmask; forming diamond-shaped or rhomboid shaped openings bound by sidewalls of the first hardmask and sidewalls of the second hardmask; forming a fifth hard mask; selectively removing the first hardmask to form diamond-shaped or rhomboid shaped openings bound by sidewalls of the first hardmask under the third hardmask and by sidewalls of the second hardmask; and selectively removing the third hardmask and the fifth hardmask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 9A is a view similar to FIG. 8A, after depositing a fifth hardmask material and patterning according to one embodiment;

FIG. 9B is a top view of the electronic device structure depicted in FIG. 9A;

FIG. 24A is a view similar to FIG. 23, after etching the wordline metal layer and wordline barrier metal layer according to one embodiment;

FIG. 24B is a top view of the electronic device structure depicted in FIG. 24A;

FIG. 24C is a side view of the electronic device structure depicted in FIG. 24A;

FIG. 25A is a view similar to FIG. 24A, after wordline etchback according to one embodiment;

FIG. 25B is a top view of the electronic device structure depicted in FIG. 25A;

FIG. 25C is a side view of the electronic device structure depicted in FIG. 25A;

DETAILED DESCRIPTION

Figures 1A, 1B:
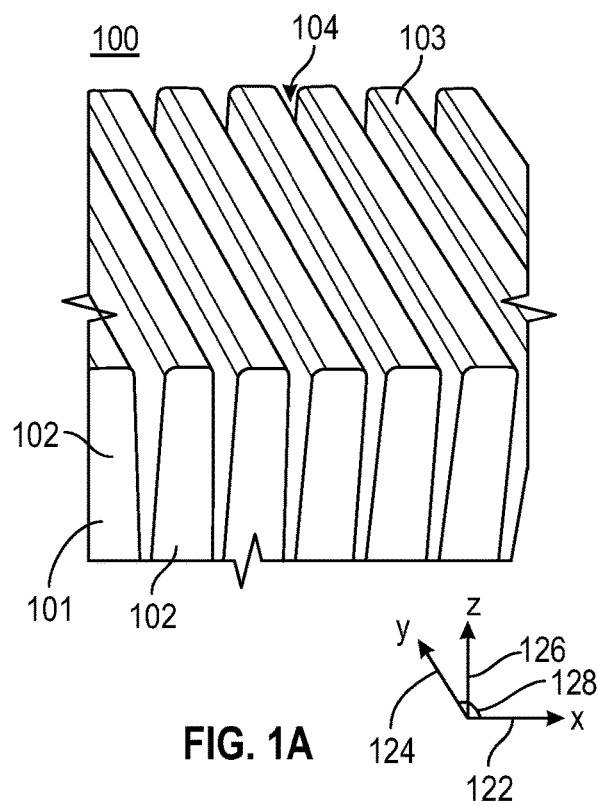
FIG. 1A illustrates a view of a patterned substrate to provide an electronic device according to one embodiment.
FIG. 1B is a top view of the electronic device structure depicted in FIG. 1A.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "active" or "memory layer" refers to a layer of material in which a channel, a bit line, a word line, or a capacitor can be made. In one or more embodiments, the memory layer comprises one or more of silicon or doped silicon. For example, in one or more embodiments, the memory layer is selected from one or more of Si, or IGZO (In—Ga—Zn Oxide).

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

In one embodiment, a fully self-aligned via is the via that is self-aligned along at least two directions to the conductive lines in a lower (or first) and an upper (or second) metallization layer. As used in this manner, the term "self-aligned" means that the vias or contacts extend beyond the edges of an underlying or overlying layer by less than or equal to about 10% of the width of the layer by a process that does not use cutting or etching processes to remove excess material to do so.

One or more embodiments of the disclosure provide self-aligned bit line contacts (BLC) for dynamic random access memory (DRAM) devices, or other memory or logic devices. One or more embodiments of the disclosure advantageously provide a process to re-use one or more of a resist, reticle, scanner, process chamber, stages, dielectric materials, insulators, bottom anti-reflective coatings (BARC), or hardmasks from Active and Active Multi-Color-Cut (MCC) layers to self-align a bit line contact. Some embodiments of the disclosure advantageously provide matches edge-placement-error (EPE) overlay, critical dimension and pitch walking fingerprints from the bottom layers (e.g., Active) and top layer (e.g., Active MCC) bit-line-contact layers. Some embodiments of the disclosure advantageously improve one or more of the bit-line-contact to Active overlay, reduce critical dimension or pitch walking tolerance by reusing one or more of mask, scanner, resist, BARC, chucks, chambers, conductor materials or dielectric materials between the Active layer, Active Cut layer and bit-line-contact. Some embodiments of the disclosure increase DRAM sort yield by reducing BLC on/off variability by improving BLC to Active EPE. Some embodiments of the disclosure advantageously reduce development costs of BLC by sharing patterning schemes with previous layers.

Comparing to the conventional techniques, some embodiments advantageously provide fully self-aligned vias with minimized bowing of the side walls during metal recess. In some embodiments, the fully self-aligned vias provide lower via resistance and capacitance benefits over the conventional vias. Some embodiments of the self-aligned vias provide full alignment between the vias and the conductive lines of the metallization layers that is substantially error free that advantageously increase the device yield and reduce the device cost. Additionally, some embodiments of the self-aligned vias provide a high aspect ratio for the fully self-aligned via. Some embodiments of the disclosure advantageously provide methods to enlarge the active area for storage node contact (SnC) landing to provide increases EPE robustness. Some embodiments advantageously provide a method of forming bit line contacts using similar $4f_2$ layout between the Active, Active Cut and BLC. Some embodiments advantageously provide methods for forming BLC for 18 nm lines and lower.

Some embodiments advantageously share reticles, materials and/or processes between the Active, Active Cut (MCC) and BLC. This enables the self-aligned process by sharing lithography, deposition and etches EPE fingerprints between the layers.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

FIG. 1A illustrates a parallel projection view 100 and a top view 110 of an electronic device structure according to one or more embodiment. In the illustrated embodiment, a substrate 101 has been patterned using an active line patterning process known to the skilled artisan to form a set of first lines 102. The set of first lines 102 have a top surface 103 and are spaced to form recesses 104. The set of first lines 102 are parallel to each other and extend along a first direction 105. For descriptive purposes only, the first lines are spaced along the X-axis direction 122, the first direction 105 is along the Y-axis (direction) 124 and the recesses extend from the top surface 103 along the Z-axis (direction) 126. The X-axis (direction) 122 crosses Y-axis (direction) 124 at an angle 128. In one embodiment, angle 128 is about 90 degrees. In another embodiment, angle 128 is an angle that is other than a 90 degree angle.

In an embodiment, the substrate 101 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, e.g., an organic, a ceramic, a glass, or a semiconductor substrate. Although a few examples of materials from which the substrate 101 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate 101 includes one or more layers above substrate 101 to confine lattice dislocations and defects.

Figure 2:
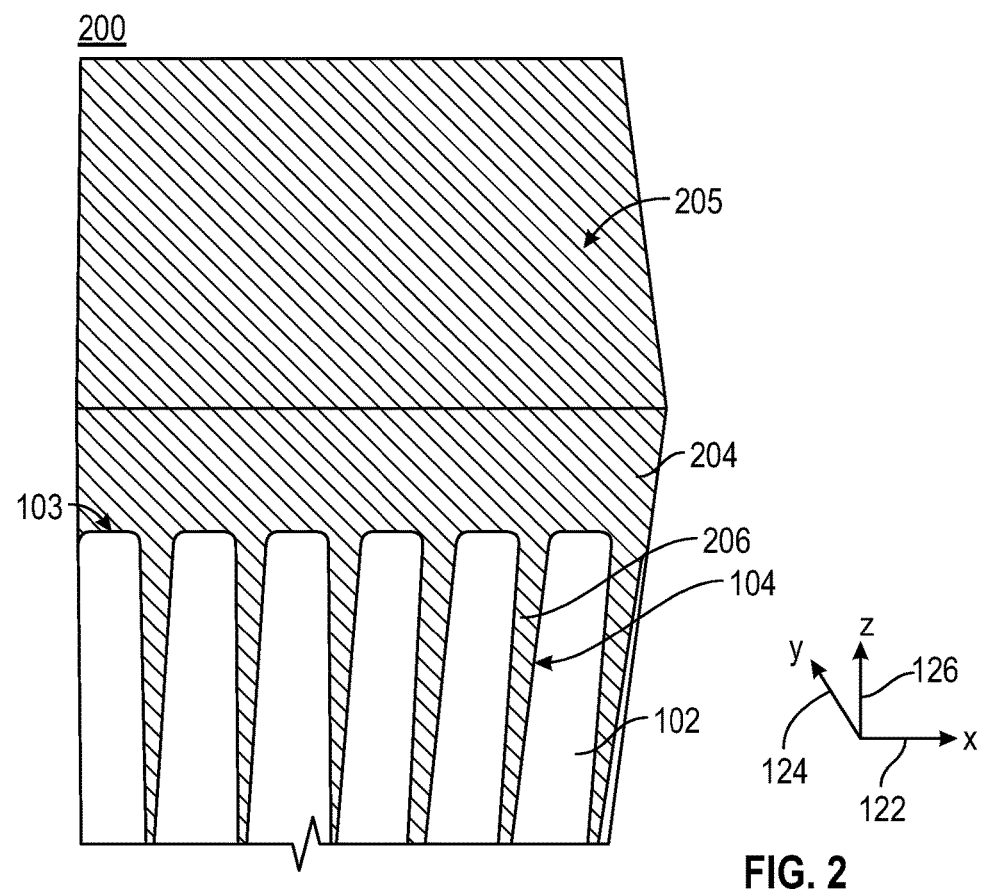
FIG. 2 is a view similar to FIG. 1A, after depositing a first hardmask according to one embodiment.

FIG. 2 is a view 200 similar to view 100 of FIG. 1A, after a shallow trench isolation (STI) process deposits a dielectric layer 204 according to one embodiment. A portion 206 of the dielectric layer 204 fills the recesses 104. The dielectric layer 204 has a thickness above the top surface 103 of the substrate 101 defined as the distance between the top surface 103 of the substrate 101 and the top surface 205 of the dielectric layer 204. The thickness above the top surface 103 is also referred to as an overburden. The overburden of some embodiments is in the range of about 10 to about 500 nm, or in the range of about 50 to about 150 nm.

In some embodiments, the top surface 205 of the dielectric layer 204 is planarized by any suitable technique known to the skilled artisan; for example, chemical-mechanical planarization (CMP).

The dielectric layer 204 can be any suitable material that can be etch selective relative to layer deposited hardmask materials. In one embodiment, dielectric layer 204 is an oxide layer, e.g., silicon dioxide, or any other electrically insulating layer determined by an electronic device design. In one embodiment, dielectric layer 204 comprises an interlayer dielectric (ILD). In one embodiment, dielectric layer 204 is a low-k dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one embodiment, dielectric layer 204 includes a dielectric material having a k-value less than 5. In one embodiment, dielectric layer 204 includes a dielectric material having a k-value less than 2. In at least some embodiments, dielectric layer 204 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, dielectric layer 204 may include polyimide, epoxy, photodefinable materials, such as benzocyclobutene (BCB), and WPR-series materials, or spin-on-glass.

In an embodiment, insulating layer is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), plasma-enhanced CVD, plasma-enhanced ALD, spin-on, or other insulating deposition techniques known to one of ordinary skill in the art of microelectronic device manufacturing.

Figure 3A:
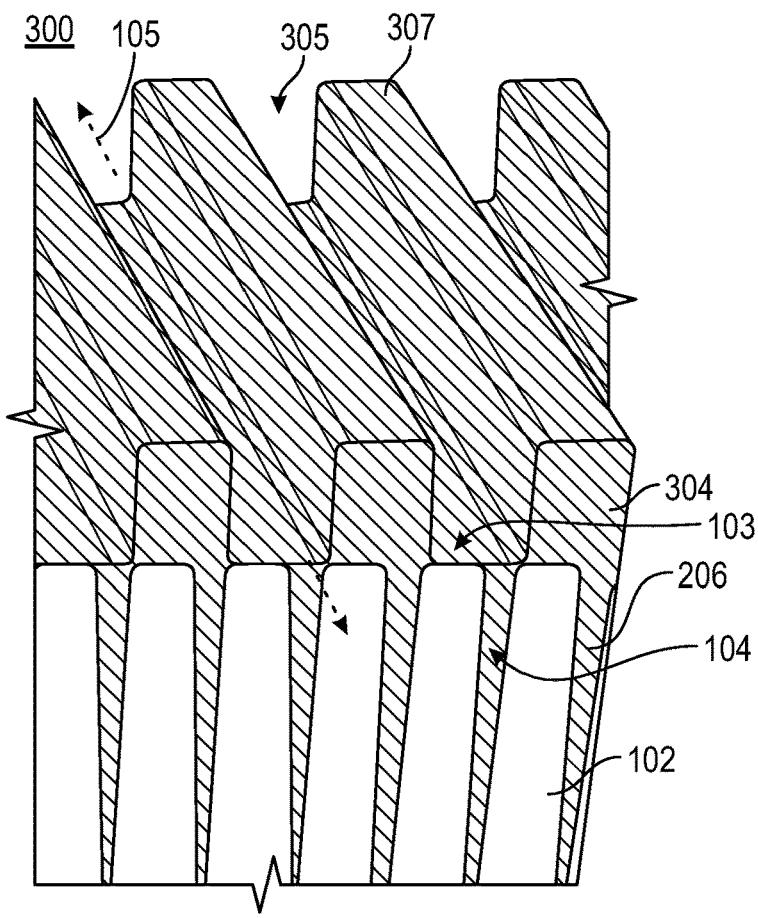
FIG. 3A is a view similar to FIG. 2, after patterning the first hardmask according to one embodiment.
Figure 3B:
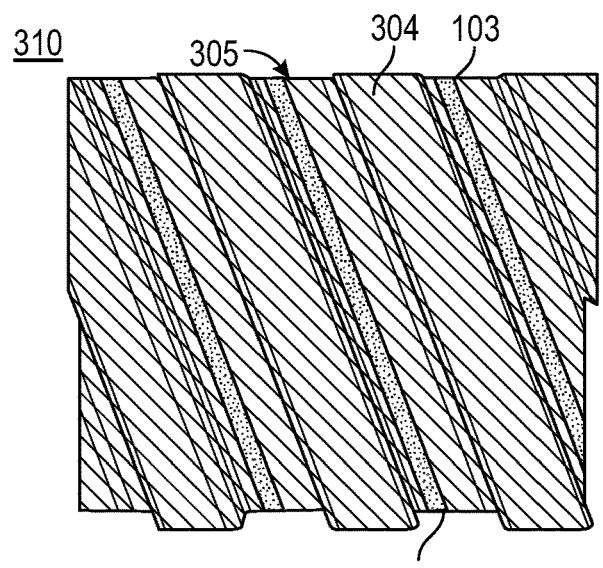
FIG. 3B is a top view of the electronic device structure depicted in FIG. 3A.

FIG. 3A is a view 300 similar to view 200 of FIG. 2 and FIG. 3B is a top view 310 of the device of FIG. 3A, after a selective patterning process according to one embodiment. The selective patterning process changes the dielectric layer 204 into first hardmask 304 with top surface 307 and a plurality of trenches 305 exposing the top surface 103 of the first lines 102. The trenches 305 extend along the same direction 105 as the first set of lines 102 and recesses 104.

Figure 3C:
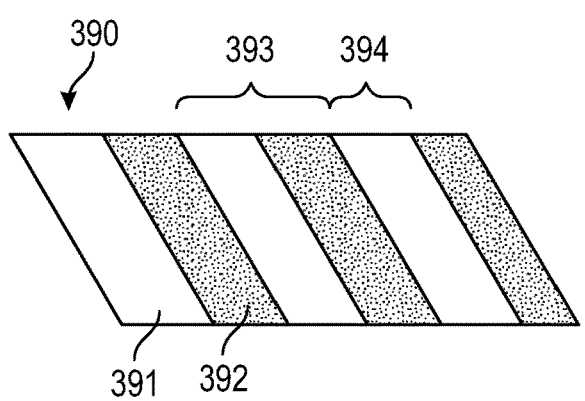
FIG. 3C is a schematic representation of a reticle for patterning the electronic device of FIG. 3A according to one embodiment.

The first hardmask 304 can be patterned by any suitable technique known to the skilled artisan. In some embodiments, referring to FIG. 3C, the first hardmask 304 is patterned with a first reticle 390. The first reticle 390 has a plurality of open regions 391 and closed regions 392 with a first pitch 393 and first spacing 394. The first reticle 390 is positioned relative to the substrate so that parts of the dielectric layer 204 aligned with the open regions 391 are etched and parts of the dielectric layer 204 aligned with the closed regions 392 remain. In some embodiments, the first reticle 390 is positioned relative to the substrate so that parts of the dielectric layer 204 aligned with the closed regions 392 are etched and parts of the dielectric layer 204 aligned with the open regions 391 remain.

In some embodiments, the first reticles 390 has a first pitch 393 in the range of about 10 nm to about 100 nm, or in the range of about 20 nm to about 80 nm, or in the range of about 30 nm to about 70 nm, or in the range of about 40 nm to about 60 nm. In some embodiments, the first reticle 390 has a first spacing 394 in the range of about 5 nm to about 50 nm, or in the range of about 10 nm to about 40 nm, or in the range of about 15 nm to about 35 nm, or in the range of about 20 nm to about 30 nm.

Figure 4A:
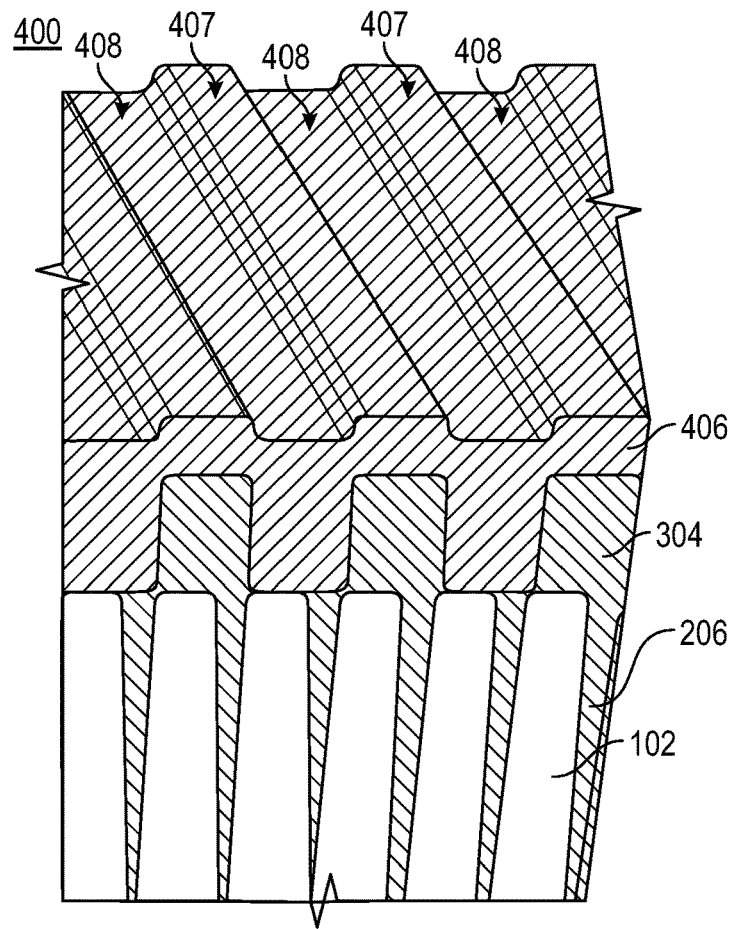
FIG. 4A is a view similar to FIG. 3A, after depositing a second hardmask on the first hardmask according to one embodiment.
Figure 4B:
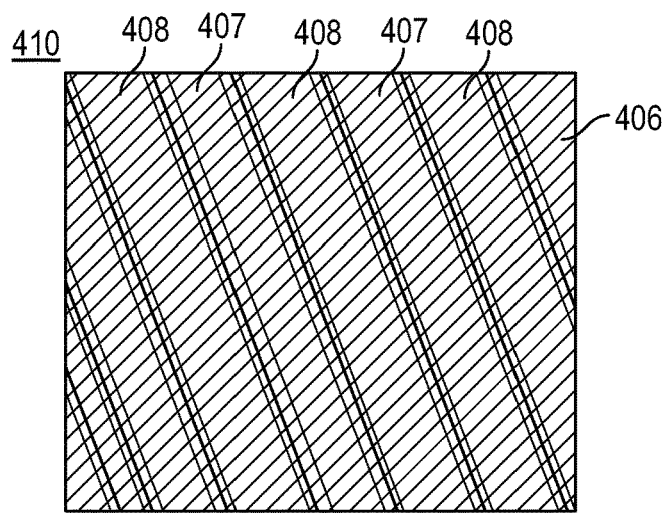
FIG. 4B is a top view of the electronic device structure depicted in FIG. 4A.

FIG. 4A is a view 400 similar to view 300 of FIG. 3A and FIG. 4B is a top view 410 similar to view 310 of FIG. 3B, after depositing a second hardmask 406 according to one embodiment. The second hardmask 406 has raised portions 407 and lower portions 408 corresponding to the shape of the patterned first hardmask 304. The second hardmask 406 can be any suitable material deposited by any suitable technique. The second hardmask 406 is etch selective relative to the first hardmask 304.

Figure 5A:
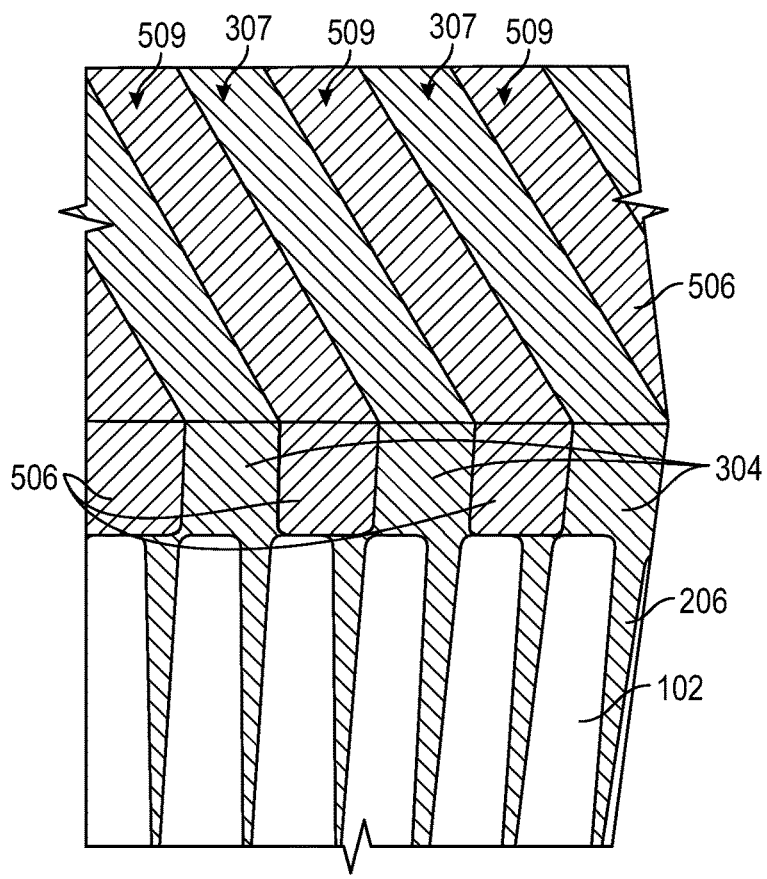
FIG. 5A is a view similar to FIG. 4A, after planarizing according to one embodiment.
Figure 5B:
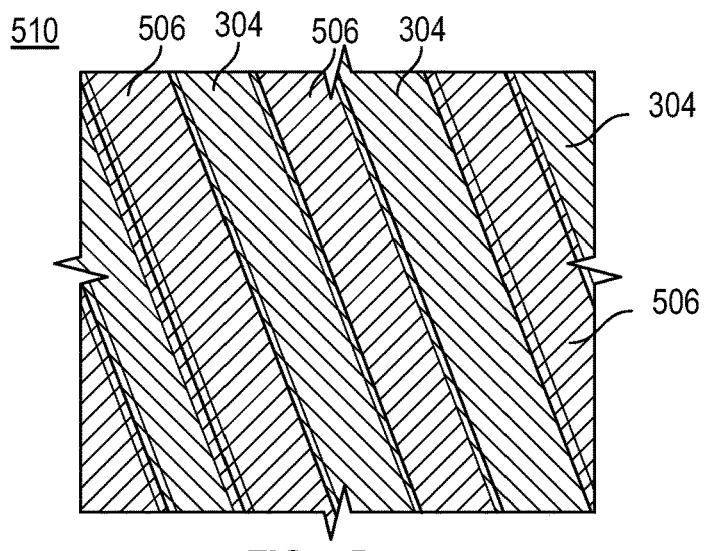
FIG. 5B is a top view of the electronic device structure depicted in FIG. 5A.

FIG. 5A is a view 500 similar to view 400 of FIG. 4A, and FIG. 5B is a top view 510 similar to view 410 of FIG. 4B, after planarizing. The surface can be planarized by any suitable technique including, but not limited to, chemical-mechanical planarization. After planarization, an alternating pattern of first hardmask 304 and second hardmask 506 is exposed so that the top surface 307 of the first hardmask 304 and the stop surface 509 of the second hardmask 506 form a striped pattern.

Figure 6:
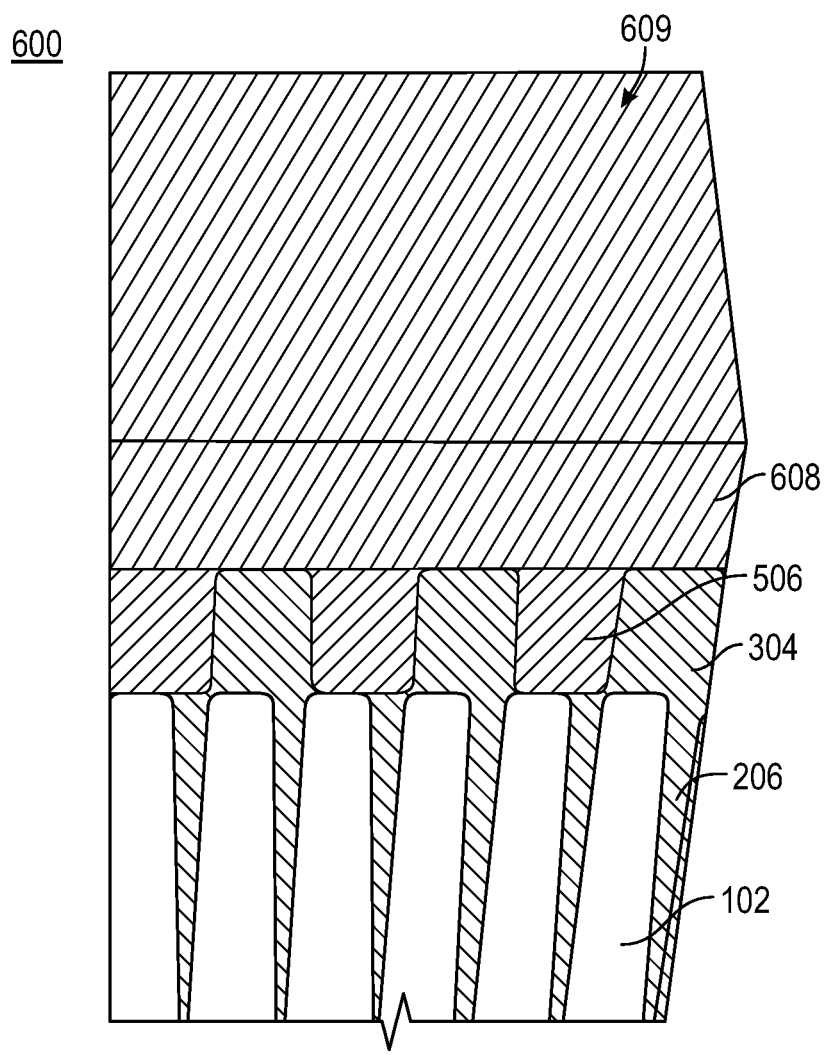
FIG. 6 is a view similar to FIG. 5A, after depositing a third hardmask material according to one embodiment.

FIG. 6 shows a view 600 similar to view 500 of FIG. 5A after deposition of a third hardmask 608. The third hardmask 608 can be any suitable material deposited by any suitable technique. The third hardmask 608 is etch selective relative to the first hardmask 304 and the second hardmask 506.

Figure 7A:
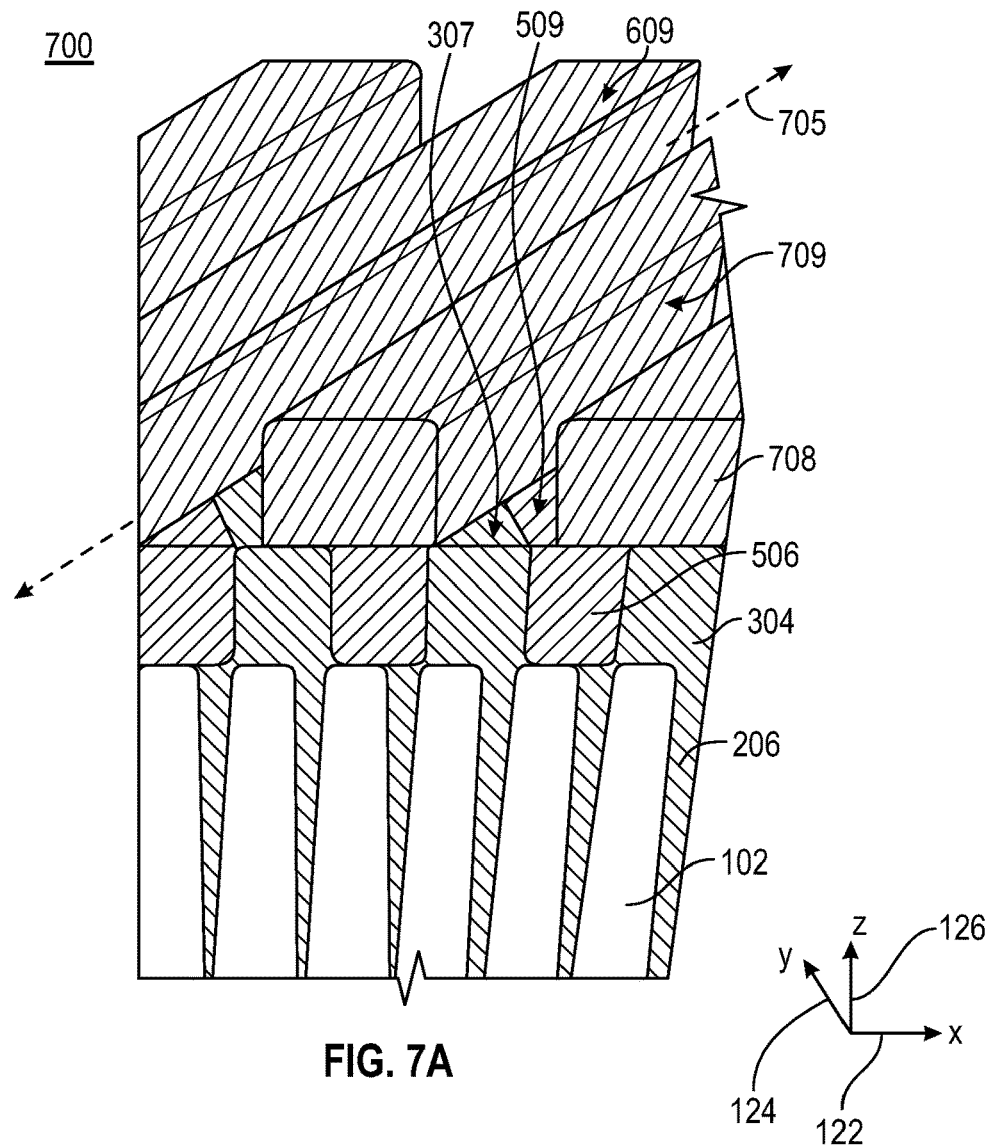
FIG. 7A is a view similar to FIG. 6, after patterning the third hardmask material according to one embodiment.
Figure 7B:
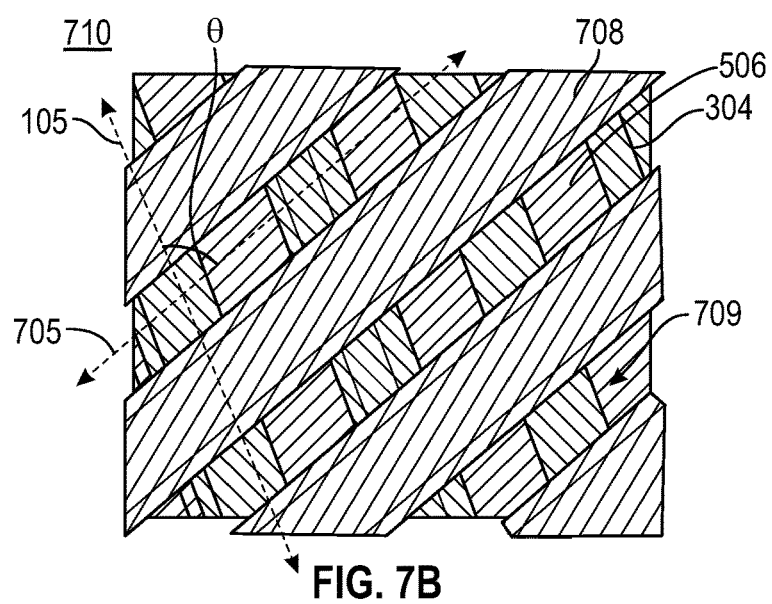
FIG. 7B is a top view of the electronic device structure depicted in FIG. 7A.

FIG. 7A shows a view 700 similar to view 600 of FIG. 6A, and FIG. 7B shows a top view 710 of the device of FIG. 7A, after selective patterning of the third hardmask 608 to form a patterned third hardmask 708. Patterning of the third hardmask 608 can be done by any suitable technique known to the skilled artisan.

Figure 7C:
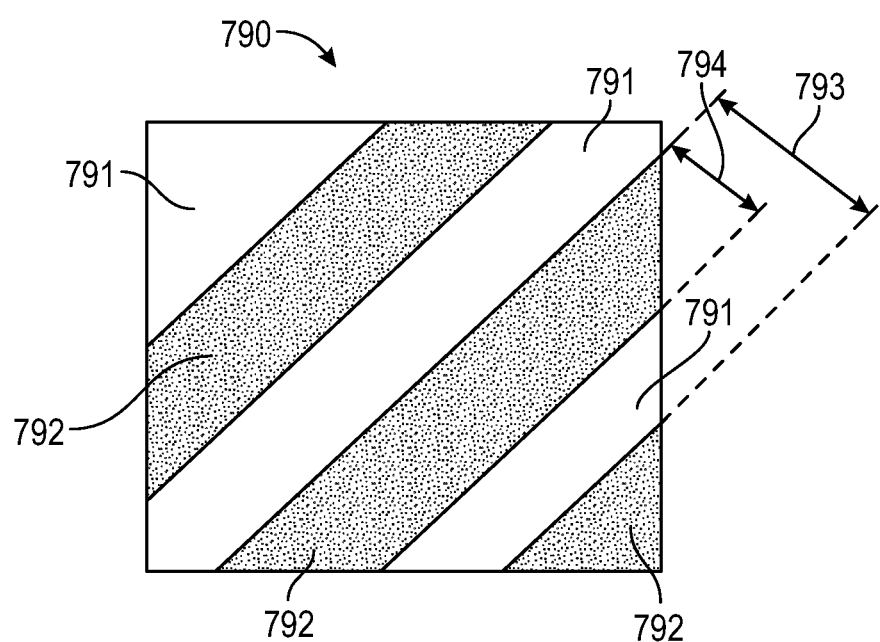
FIG. 7C is a schematic representation of a reticle for patterning the electronic device of FIG. 7A according to one embodiment.

In some embodiments, the third hardmask 608 is patterned by a lithographic technique using a second reticle 790, as shown in FIG. 7C. The second reticle 790 has a plurality of open regions 791 and closed regions 792 with a second pitch 793 and second spacing 794. The second reticle 790 is positioned relative to the substrate so that parts of the third hardmask 608 aligned with the open regions 791 are etched and parts of the third hardmask 608 aligned with the closed regions 792 remain. In some embodiments, the second reticle 790 is positioned relative to the substrate so that parts of the third hardmask 608 aligned with the closed regions 792 are etched and parts of the third hardmask 608 aligned with the open regions 791 remain. Because the third hardmask 608 is etch selective relative to the second hardmask 506 and the first hardmask 304, the anisotropic etch process stops at the top surface 307 of the first hardmask 304 and the top surface 509 of the second hardmask 506.

In some embodiments, the second reticle 790 has a second pitch 793 in the range of about 10 nm to about 100 nm, or in the range of about 20 nm to about 80 nm, or in the range of about 30 nm to about 70 nm, or in the range of about 40 nm to about 60 nm. In some embodiments, the second reticle 790 has a second spacing 794 in the range of about 5 nm to about 50 nm, or in the range of about 10 nm to about 40 nm, or in the range of about 15 nm to about 35 nm, or in the range of about 20 nm to about 30 nm. In some embodiments, the second reticle 790 is the same as the first reticle 390 rotated around the Z-axis (direction) 126.

After patterning, the patterned third hardmask 708 has a top surface 609 and a plurality of channels 709 formed therein. The channels 709 of the patterned third hardmask 708 extend along a second direction 705 that is different from the first direction 105. In some embodiments, the angle made by the intersection of the first direction 105 and the second direction 705 is in the range of about 40°-90°, or in the range of about 50°-80°, or in the range of about 60°-75°, or in the range of about 67-70°. The angle of the intersection is measured as the smaller of the angles of intersection of the lines formed by the first direction 105 and the second direction 705.

Figure 8A:
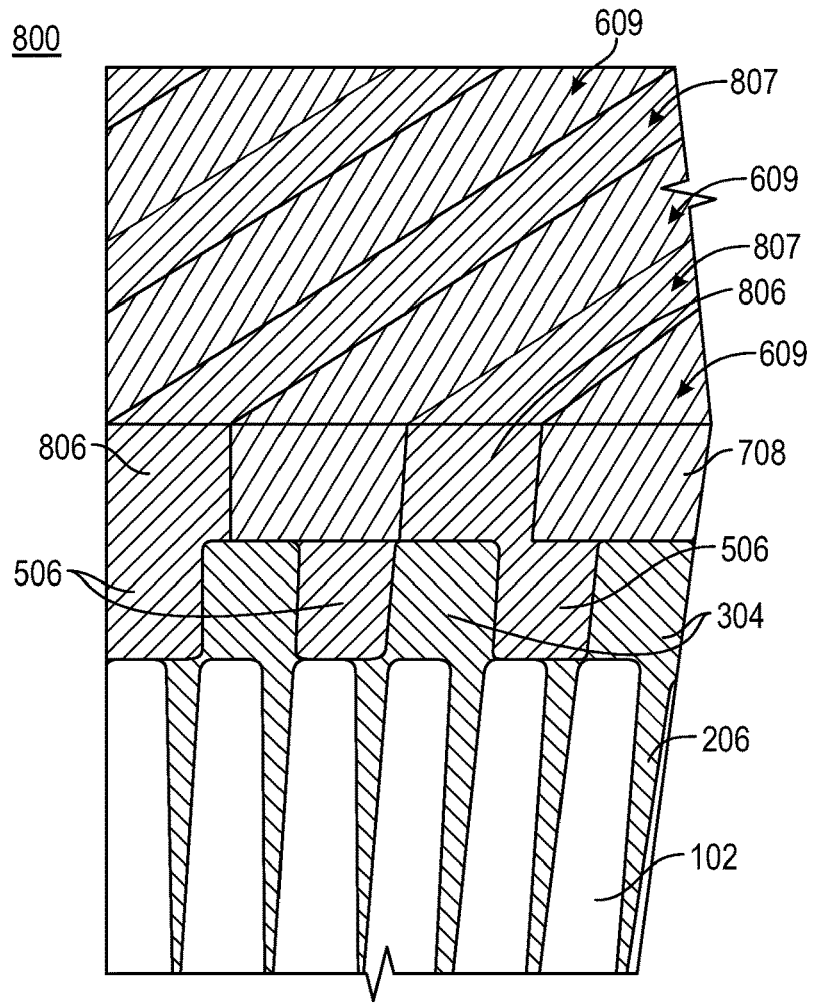
FIG. 8A is a view similar to FIG. 7A, after depositing a fourth hardmask and planarizing according to one embodiment.
Figure 8B:
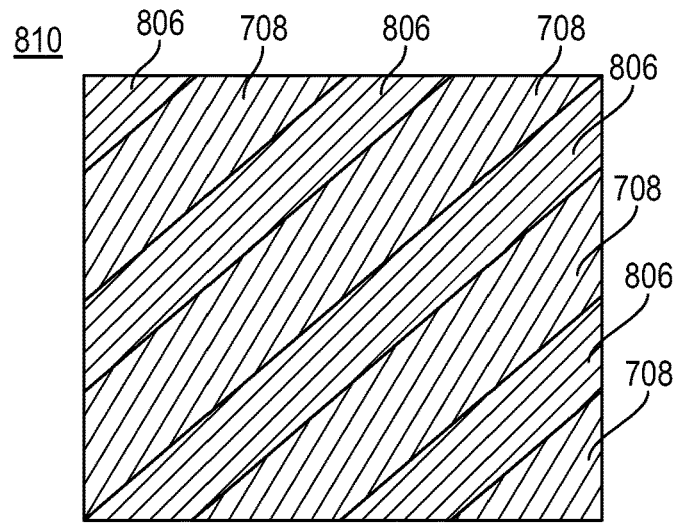
FIG. 8B is a top view of the electronic device structure depicted in FIG. 8A.

FIG. 8A is a view 800 similar to FIG. 7A, and FIG. 8B is a view 810 similar to FIG. 7B after deposition of another hardmask 806 that is etch selective to the first hardmask 304 and third hardmask 708. The hardmask 806 can be the same material as the second hardmask 506, which is etch selective to the first hardmask 304 and third hardmask 708. The additional 806 material can remain separate from the second hardmask 506 or meld into a unified layer of second hardmask 506/806. In some embodiments, the hardmask 806 is a different material than the second hardmask 506 material (not shown). Whether the hardmask 806 is the same material as the second hardmask 506 or a different material, the skilled artisan will recognize that the second hardmask 506 extends along a first direction 105 and the hardmask 806 extends along second direction 705 so that there are portions of the hardmask 806 that are above the first hardmask 304 only.

The hardmask 806 can be deposited in the channels 709 formed in the third hardmask 708 so that the top surface 807 of the hardmask 806 is level with the top surface 609 of the third hardmask 708. In some embodiments, as will be recognized by the skilled artisan, the hardmask 806 can be deposited to form an overburden on the top surface 609 of the third hardmask 708 (similar to that shown in FIGS. 4A and 4B for the second hardmask 406) followed by a planarization process (similar to that shown in FIGS. 5A and 5B for the second hardmask 506). The planarization process can be any suitable process known to the skilled artisan to expose a top surface 609 of the third hardmask 708 and a top surface 807 of the hardmask 806.

FIG. 9A is a view 900 similar to view 800 of FIG. 8A, and FIG. 9B is a view 910 similar to view 810 of FIG. 8B after deposition of a fourth hardmask material followed by a patterning process to form a patterned fourth hardmask 912 with a top surface 914 and channels 913. The top surface 807 of the hardmask 806 and top surface 609 of the hardmask 708 are exposed in the channels 913 formed in the fourth hardmask 912. The channels 913 and fourth hardmask 912 lines extend in the second direction 705 similar to the third hardmask 708 and hardmask 807.

The fourth hardmask 912 can be made of any suitable material deposited by any suitable technique. The fourth hardmask 912 is etch selective relative to the first hardmask 304, second hardmask 506, hardmask 806 and third hardmask 708.

Figure 9C:
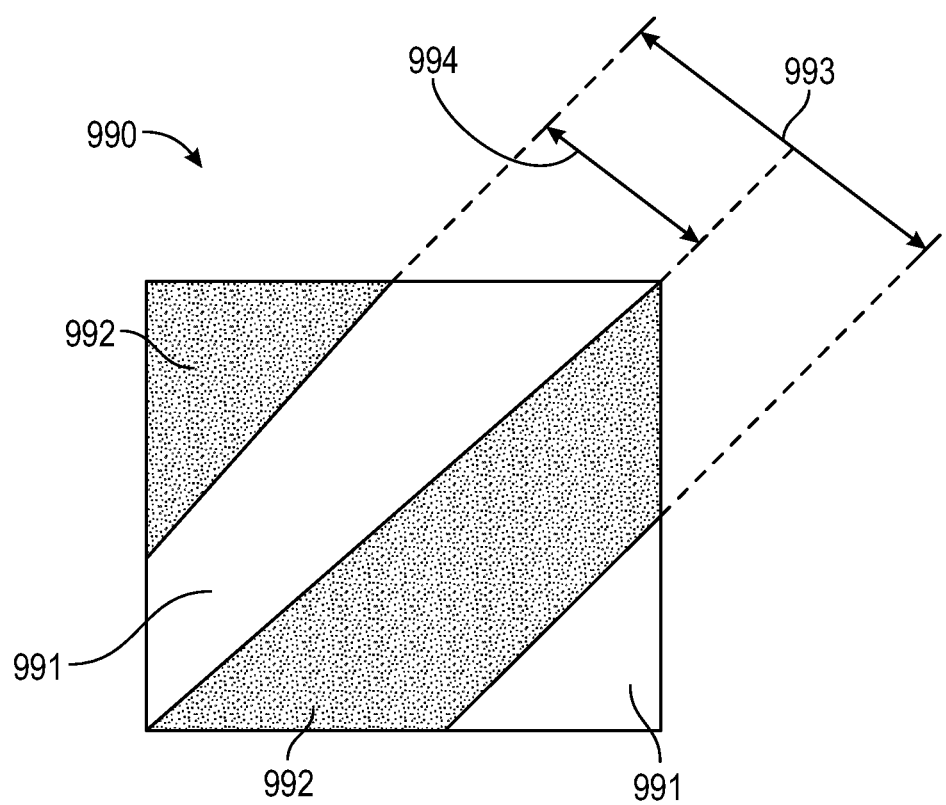
FIG. 9C is a schematic representation of a reticle for patterning the electronic device of FIG. 9A according to one embodiment.

In some embodiments, the fourth hardmask 912 is patterned by a lithographic technique using a third reticle 990, as shown in FIG. 9C. The third reticle 990 has a plurality of open regions 991 and closed regions 992 with a third pitch 793 and third spacing 794. The third reticle 990 is positioned relative to the substrate so that parts of the fourth hardmask 912 aligned with the open regions 991 are etched and parts of the fourth hardmask 912 aligned with the closed regions 992 remain. In some embodiments, the third reticle 990 is positioned relative to the substrate so that parts of the fourth hardmask 912 aligned with the closed regions 992 are etched and parts of the fourth hardmask 912 aligned with the open regions 991 remain. Because the fourth hardmask 912 is etch selective relative to the hardmask 806 and the third hardmask 708, the anisotropoic etch process stops at the top surface 609 of the third hardmask 708 and the top surface 807 of the hardmask 806.

In some embodiments, the third reticle 990 has a third pitch 993 in the range of about 20 nm to about 200 nm, or in the range of about 40 nm to about 160 nm, or in the range of about 60 nm to about 140 nm, or in the range of about 80 nm to about 120 nm. In some embodiments, the third reticle 990 has a third spacing 994 in the range of about 10 nm to about 100 nm, or in the range of about 20 nm to about 80 nm, or in the range of about 30 nm to about 70 nm, or in the range of about 40 nm to about 60 nm. In some embodiments, the third reticle 990 is the same as the second reticle 790 with a different focal length.

Figure 10A:
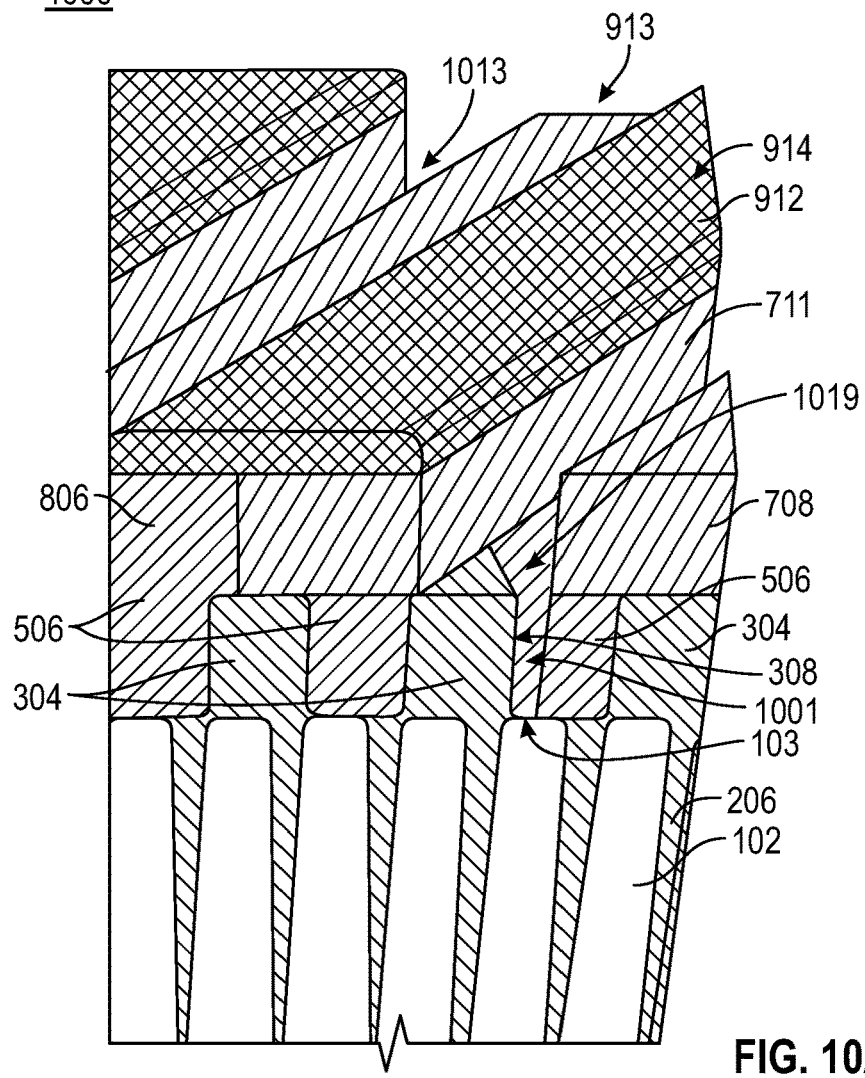
FIG. 10A is a view similar to FIG. 9A, after selectively etching the second hardmask according to one embodiment.
Figure 10B:
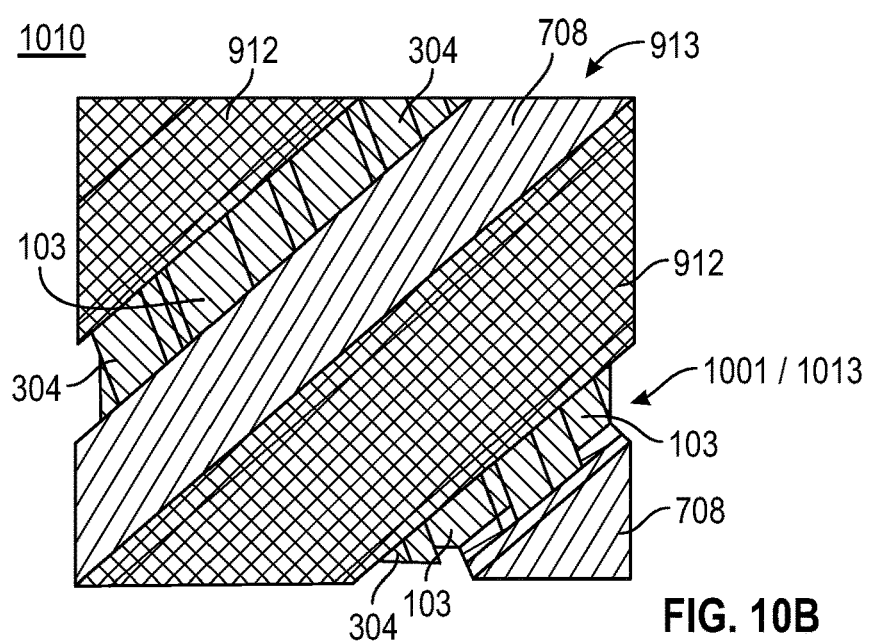
FIG. 10B is a top view of the electronic device structure depicted in FIG. 10A.

FIG. 10A is a view 1000 similar to view 910 of FIG. 9A, and FIG. 10B is a view 1010 similar to view 910 of FIG. 9B after selective etching of the hardmask 806 and second hardmask 506 exposed through channel 913. The etch process can be any suitable etch process known to the skilled artisan. As the hardmask 806 and second hardmask 506 are etch selective relative to the first hardmask 304 and fourth hardmask 912, the anisotropic etch process exposes sidewalls 711 of the third hardmask 708 through the channels 1013 by removal of the hardmask 806. Additionally, the sidewalls 308 of the first hardmask 304 are exposed in the channel 1001 formed by removal of the second hardmask 506 through the channel 1013 formed through the hardmask 806. In the top view 1010, channel 1001 and channel 1013 are seen as a single channel due to the overlap portions being removed.

The selective etch process results in the formation of diamond-shaped or rhomboid-shaped openings 1019 bounded by sidewalls 308 of first hardmask 304 and sidewalls 507 of second hardmask 506. The particular shapes and angles of the openings 1019 are affected by, for example, the angle of intersection of the first direction 105 and second direction 705 and the width of the channel 1013.

The etch process used to remove the hardmask 806 and second hardmask 506 through channel 913 can be a single process condition or multiple process conditions. If the second hardmask 506 and hardmask 806 are the same material, a single process can be used to etch the hardmask 806 to expose portions of the second hardmask 506, and etch the exposed second hardmask 506. If the second hardmask 506 and hardmask 806 use different etch conditions, the hardmask 806 can be etched in a first process followed by removal of the exposed portions of the second hardmask 506 in a second process. In the illustrated embodiment, the thickness of the fourth hardmask 912 is decreased due to some etching. The fourth hardmask 912 is etch selective because there is sufficient fourth hardmask 912 remaining after the etch process to prevent material under the fourth hardmask 912 from being removed.

Figure 11A:
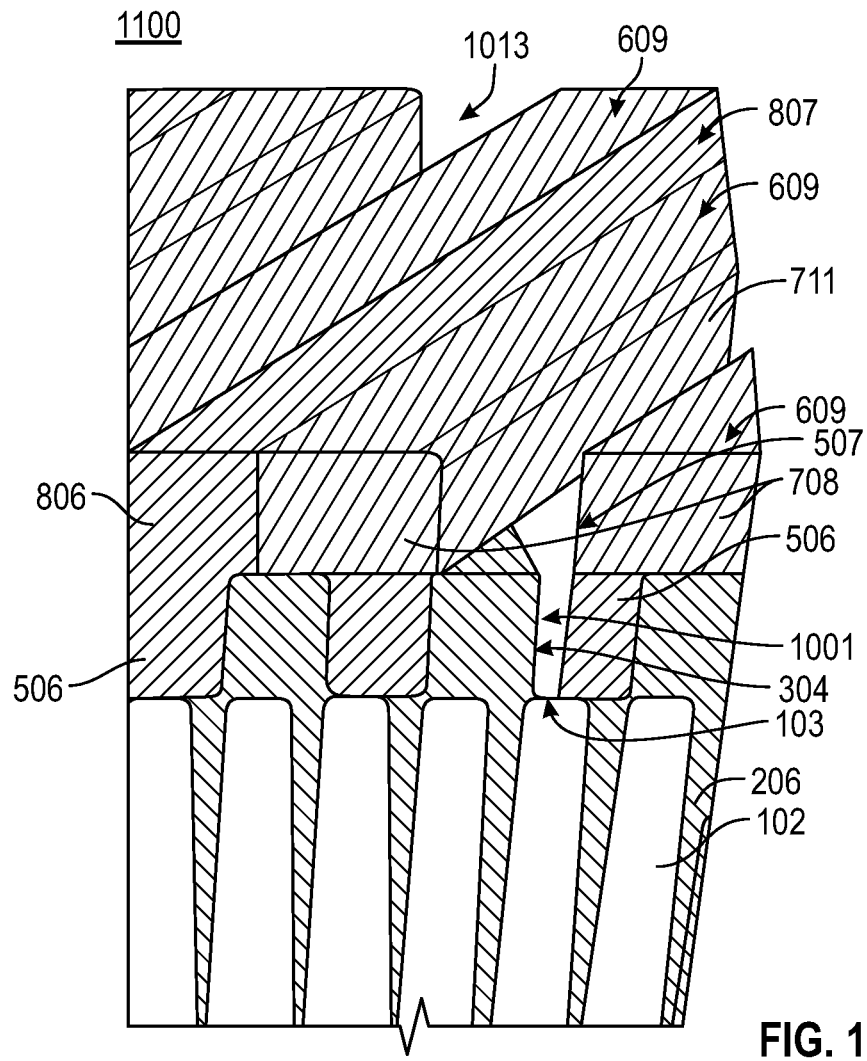
FIG. 11A is a view similar to FIG. 10A, after removing the fifth hardmask according to one embodiment.
Figure 11B:
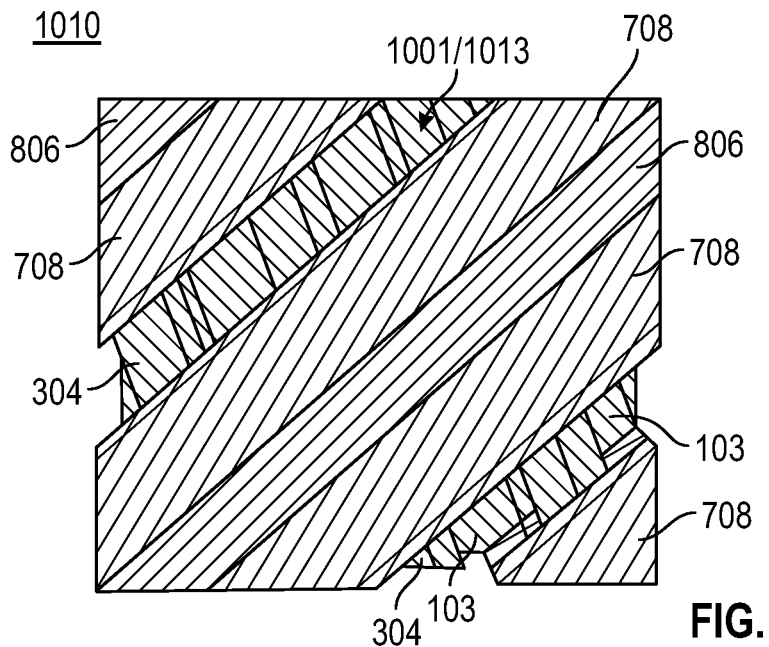
FIG. 11B is a top view of the electronic device structure depicted in FIG. 11A.

FIG. 11A is a view 1100 similar to view 1000 of FIG. 10A, and FIG. 11B is a view 1110 similar to view 1010 of FIG. 10B after removal of the fourth hardmask 912. The fourth hardmask 912 can be removed by any suitable process known to the skilled artisan (e.g., selective stripping, ashing). In some embodiments, separate removal of the fourth hardmask 912 is not performed at this point; rather, the fourth hardmask 912 can be removed as part of the planarization process discussed with respect to FIG. 12.

Figure 12:
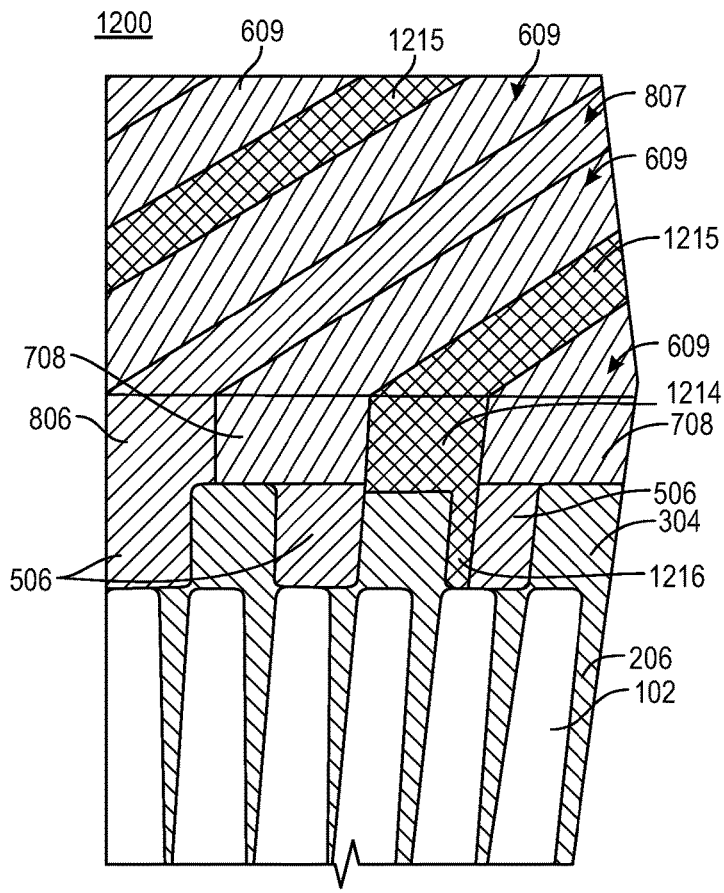
FIG. 12 is a view similar to FIG. 11A, after planarizing according to one embodiment.

FIG. 12 is a view 1200 similar to view 1100 of FIG. 11A after deposition of fifth hardmask 1214. The fifth hardmask 1214 of some embodiments is the same material as the fourth hardmask 1214, but can be a different material that is etch selective relative to the third hardmask 708, hardmask 806, second hardmask 506 and first hardmask 304. The portion of the fifth hardmask 1214 filling channel 1001 is designated as fifth hardmask 1216 but it will be understood that the fifth hardmask can be a single unified film.

The embodiment illustrated in FIG. 12 has a top surface 1215 of the fifth hardmask 1214 even with the top surface 609 of the third hardmask 708 and top surface 807 of hardmask 806. The surfaces can be even by deposition to the correct depth or by a multistep process of depositing the fifth hardmask 1214 to form an overburden followed by planarization (as shown for a similar process in FIGS. 4A through 5B).

Figure 13:
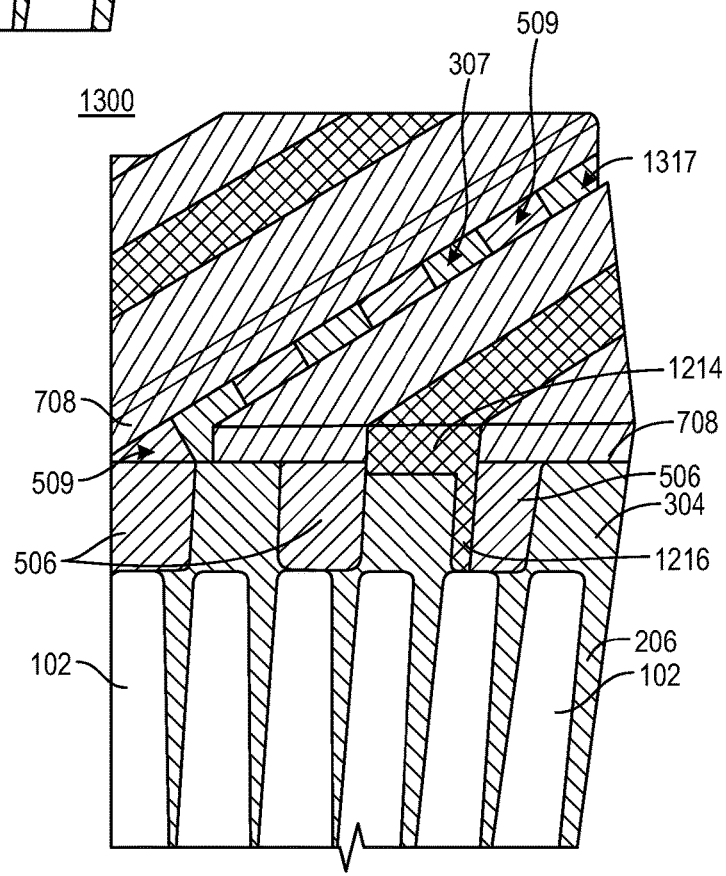
FIG. 13 is a view similar to FIG. 12, after selectively etching the fourth hardmask according to one embodiment.

FIG. 13 is a view 1300 similar to view 1200 of FIG. 12 after selectively removing hardmask 806. After hardmask 806 is removed, the top surface 509 of second hardmask 506 and top surface 307 of first hardmask 304 are exposed through channel 1317 formed by removal of the hardmask 806. In some embodiments, the second hardmask 506 and hardmask 806 are the same material and the selective removal process is controlled to stop at the top surface 307 of the first hardmask 304. In some embodiments, the second hardmask 506 and hardmask 806 are different materials that are etch selective relative to each other and the etch process will stop by virtue of the selectivity of the hardmasks. The embodiment illustrated, which is merely representative of one possible configuration, shows that the thicknesses of the third hardmask 708 and fifth hardmask 1214 have been decreased as part of the etch process.

Figure 14A:
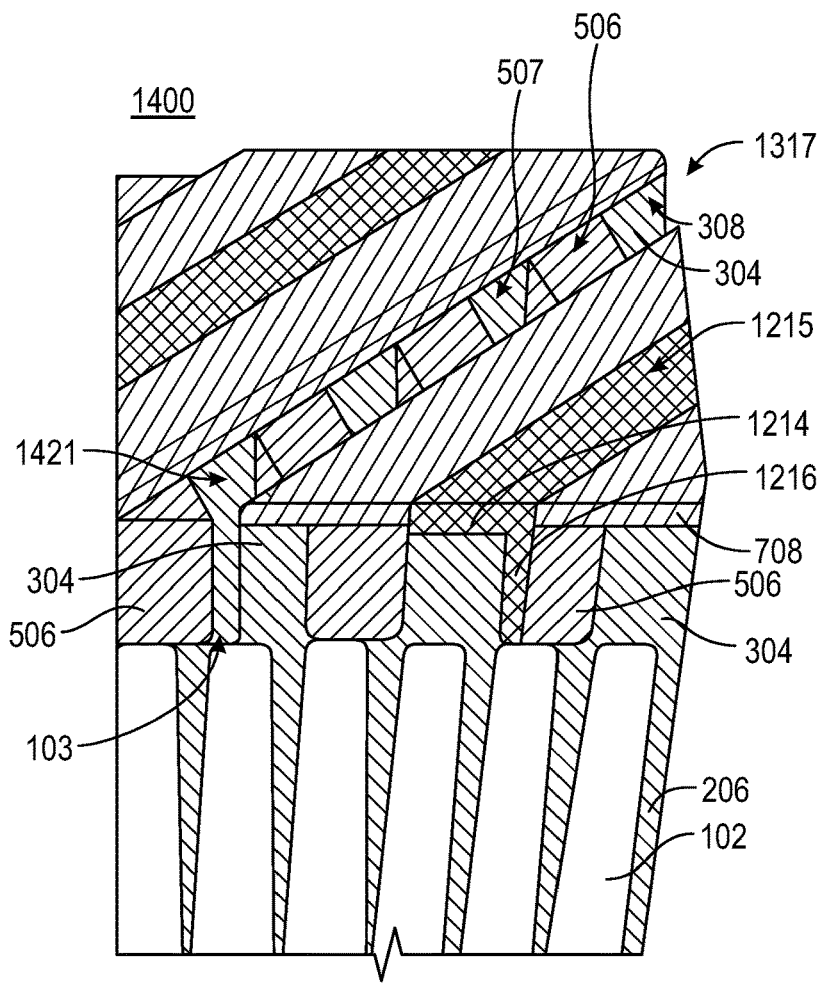
FIG. 14A is a view similar to FIG. 13A, after selectively etching the first hardmask according to one embodiment.
Figure 14B:
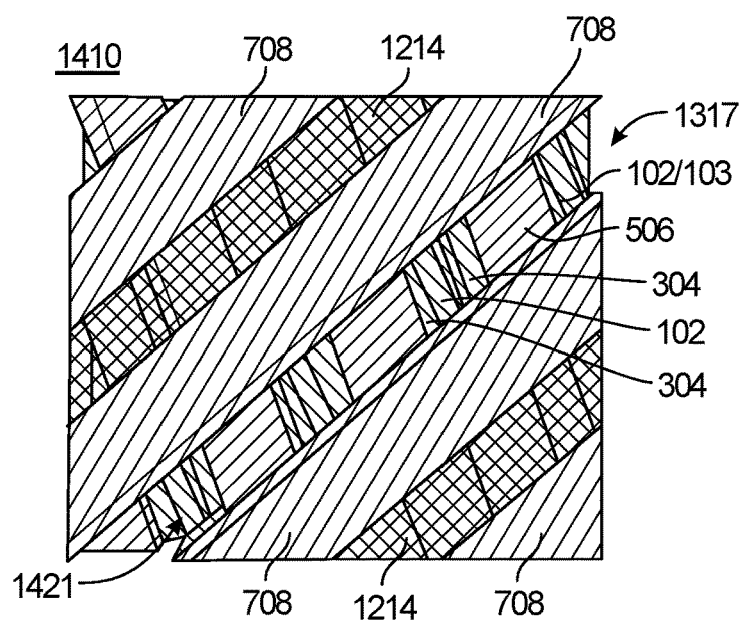
FIG. 14B is a top view of the electronic device structure depicted in FIG. 14A.

FIG. 14A is a view 1400 similar to view 1300 of FIG. 13, and FIG. 14B is a top view 14310 of the embodiment of FIG. 14A after selective removal of the first hardmask 304 exposed through channel 1317. The selective removal of the first hardmask 304 through the channel 1317 exposes portions of the substrate 102 and generates diamond-shaped or rhomboid-shaped openings 1421. The openings 1421 are bounded on two sides by the sidewall 308 of the first hardmask 304 under third hardmask 708 and by sidewalls 507 of the second hardmask 506 aligned with channel 1317.

Figure 15A:
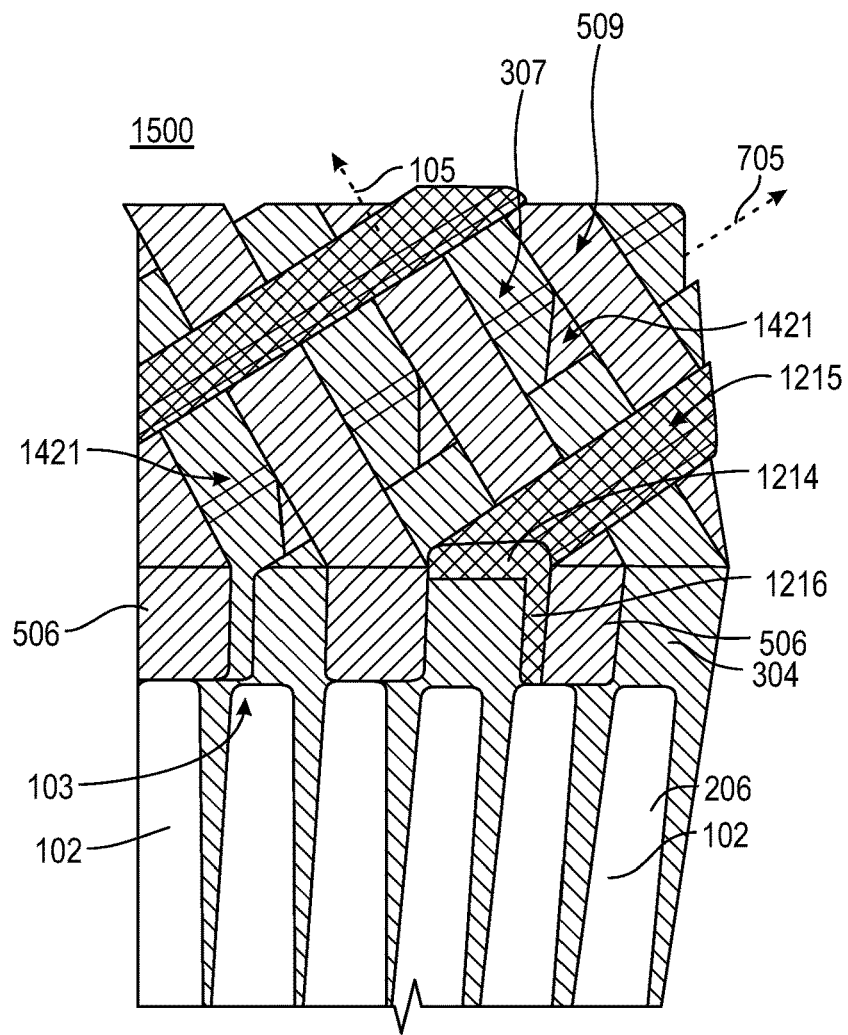
FIG. 15A is a view similar to FIG. 14A, after removing the third hardmask according to one embodiment.

FIG. 15A is a view 1500 similar to view 1400 of FIG. 14A, and FIG. 14B is a view 1510 similar to view 1410 FIG. 14B, after removal of the third hardmask 708. The third hardmask 708 is removed by a selective removal process to expose the top surface 307 of the first hardmask 304, top surface 509 of the second hardmask 506 and leave the fifth hardmask 1214. The selective removal process can be improved by the use of etch selective materials for the different hardmask materials. The embodiment shown in the drawings illustrates the first hardmask 304 and second hardmask 506 extending along the first direction 105 and the fifth hardmask 1214 and line of openings 1421 extending along the second direction 705.

Figure 15B:
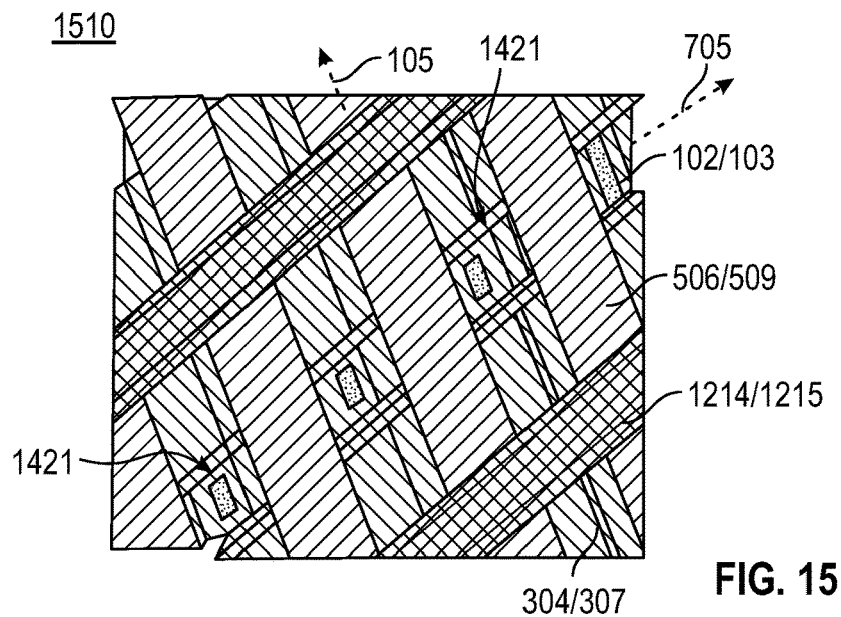
FIG. 15B is a top view of the electronic device structure depicted in FIG. 15A.
Figure 16A:
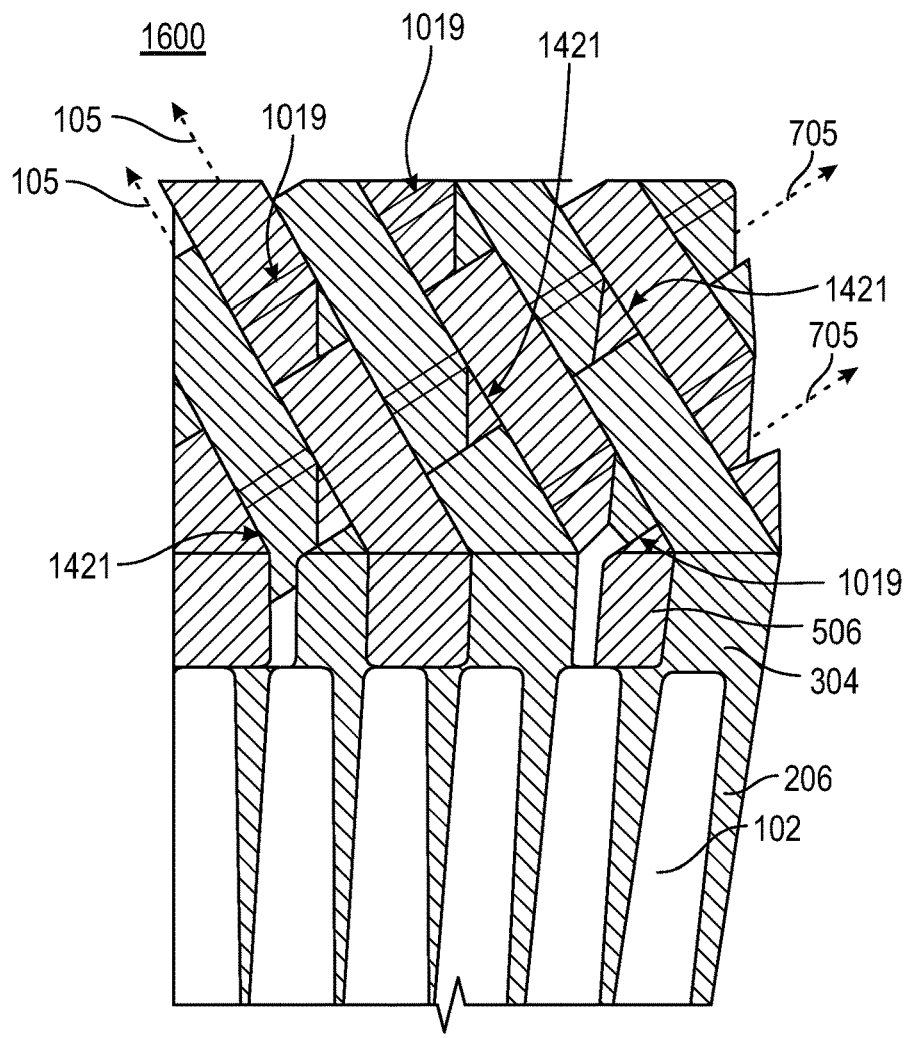
FIG. 16A is a view similar to FIG. 15A, after removing the fourth hardmask according to one embodiment.
Figure 16B:
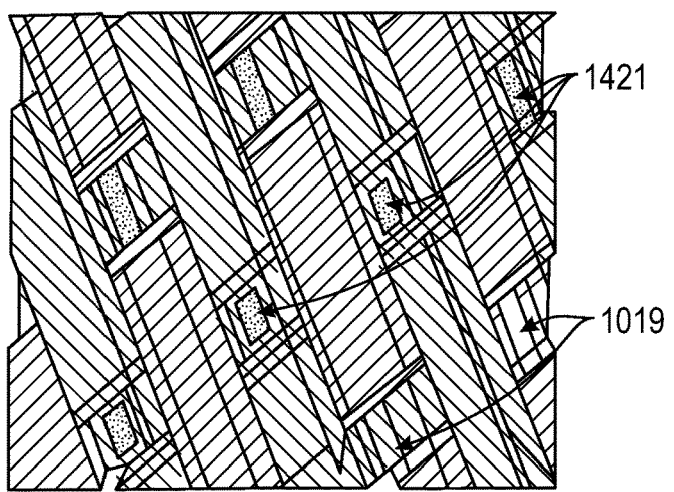
FIG. 16B is a top view of the electronic device structure depicted in FIG. 16A.

FIG. 16A is a view 1600 similar to view 1500 of FIG. 15A, and FIG. 16B is a view 1610 similar to view 1510 of FIG. 15B, after removal of the fifth hardmask 1214 by a selective removal process. Up to this point, the fifth hardmask 1214 has been protecting the rhomboid-shaped openings 1019 during formation of the rhomboid-shaped openings 1421. The illustrated embodiments shows how the openings 1019 and 1421 alternate along both the first direction 105 and second direction 705 with all of the openings 1019 being formed in the second hardmask 506 and all of the openings 1421 being formed in the first hardmask 304.

Figure 17A:
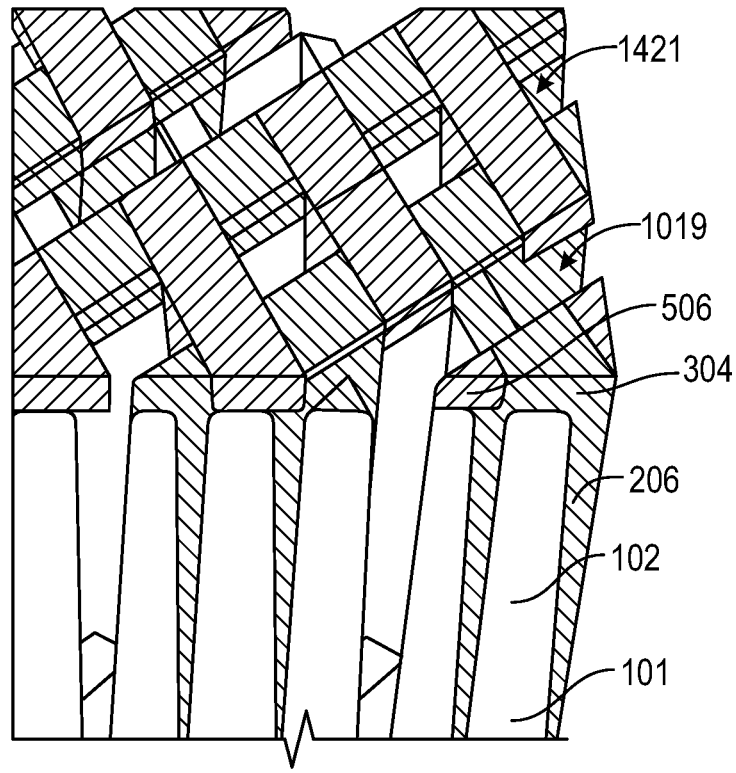
FIG. 17A is a view similar to FIG. 16A, after transferring the pattern to the substrate according to one embodiment.
Figure 17B:
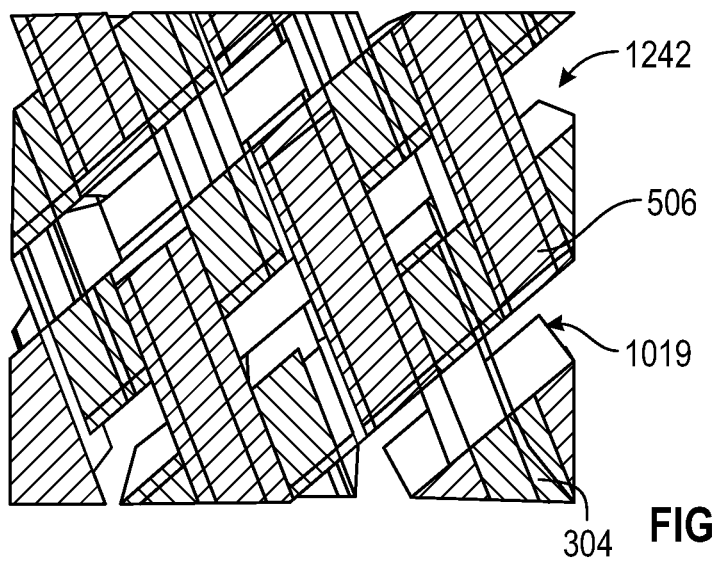
FIG. 17B is a top view of the electronic device structure depicted in FIG. 17A.

FIG. 17A is a view 1700 similar to view 1600 of FIG. 16A, and FIG. 17B is a view 1710 similar to view 1610 of FIG. 16B, after etching the pattern of openings 1019, 1421 into the substrate 101. This process creates breaks in the first lines 102, which are seen in FIGS. 18A and 18B.

Figure 18A:
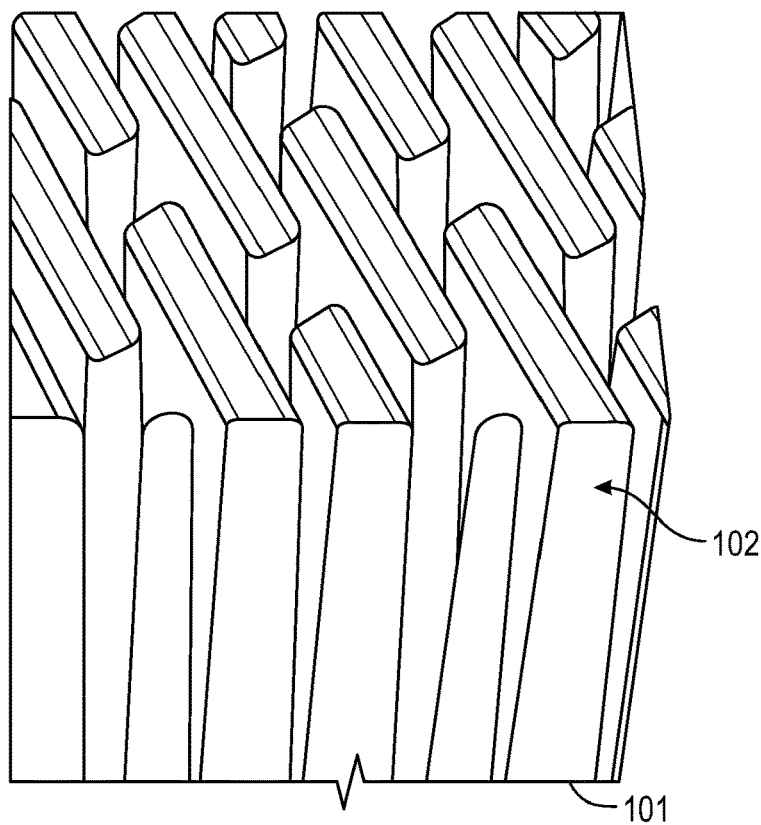
FIG. 18A is a view similar to FIG. 17A, after removing the first hardmask and second hardmask according to one embodiment.
Figure 18B:
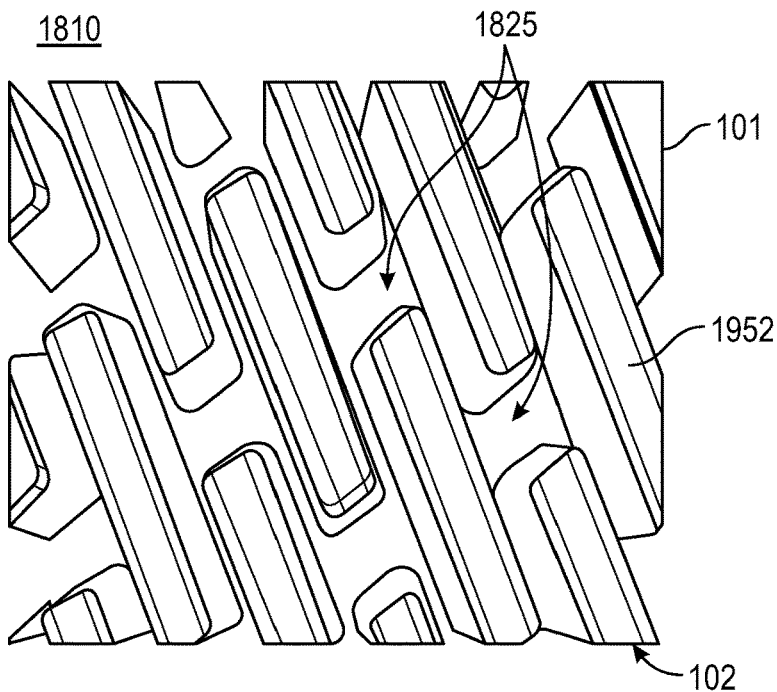
FIG. 18B is a top view of the electronic device structure depicted in FIG. 18A.

FIG. 18A is a view 1800 similar to view 1700 of FIG. 17A, and FIG. 18B is a view 1810 similar to view 1710 of FIG. 17B, after removal of the remaining first hardmask 304 and second hardmask 506 to leave the substrate 101 with a plurality of diamond-shaped or rhomboid-shaped openings 1825. The first hardmask 304 and second hardmask 506 can be removed separately or at the same time by any suitable technique(s) known to the skilled artisan.

In some embodiments, the substrate 101 comprises active silicon. In some embodiments, the active silicon is subjected to one or more of a push, trim or epi process to repair channel mobility, as will be understood by the skilled artisan.

FIG. 19 illustrates a partial schematic to view 1900 of an electronic device 1950 according to one or more embodiment of the disclosure. The electronic device 1950 illustrated is showing the top down view of the first lines 102 of the substrate 101. The first lines 102 are on an underlying substrate 101 material or are a portion of an underlying substrate. For example, the first lines 102 can be a top portion of a substrate 101 with solid material below.

Figure 19A:
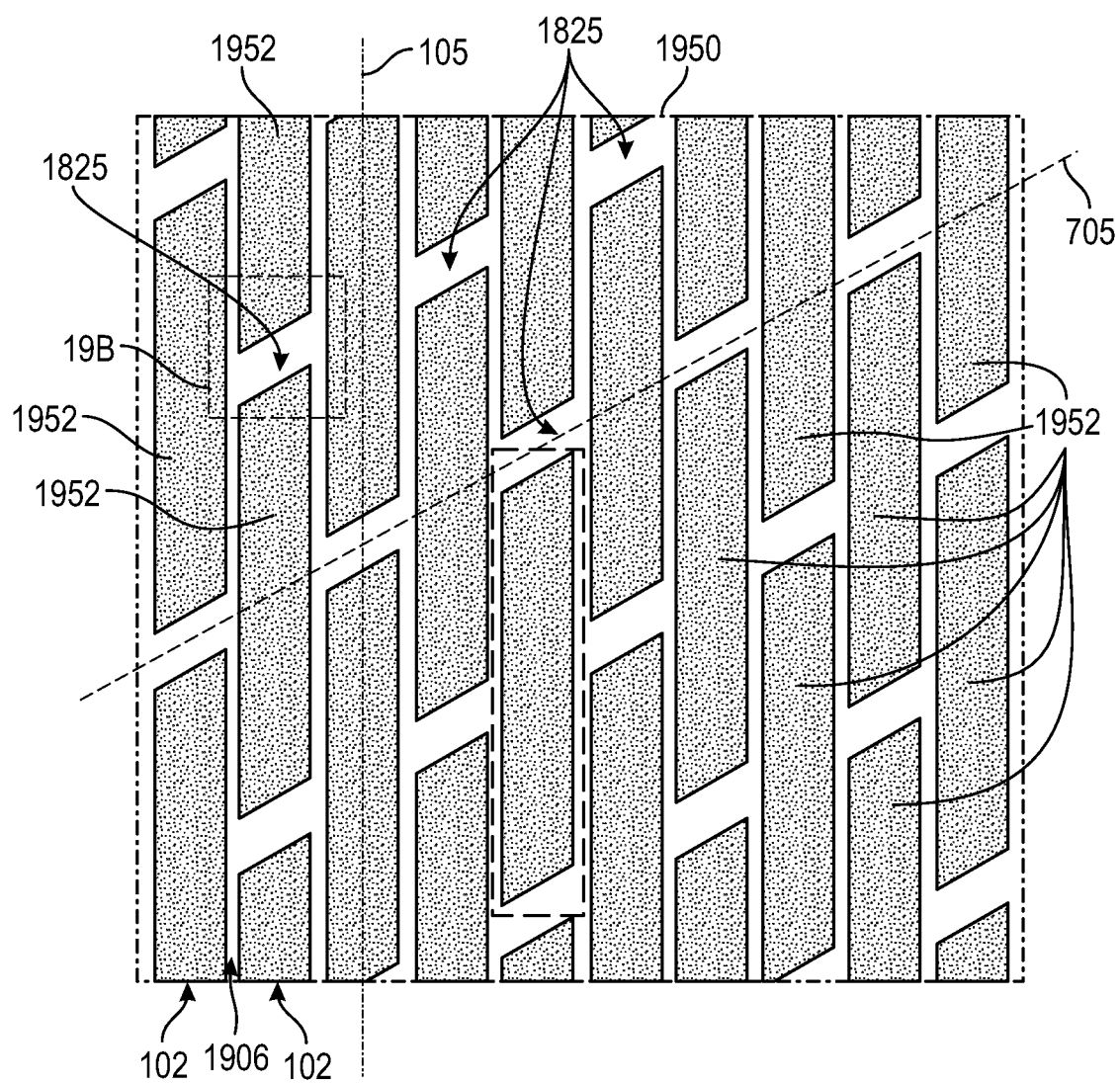
FIGS. 19A-19C are schematic views of the patterned substrate according to one embodiment.
Figure 19C:
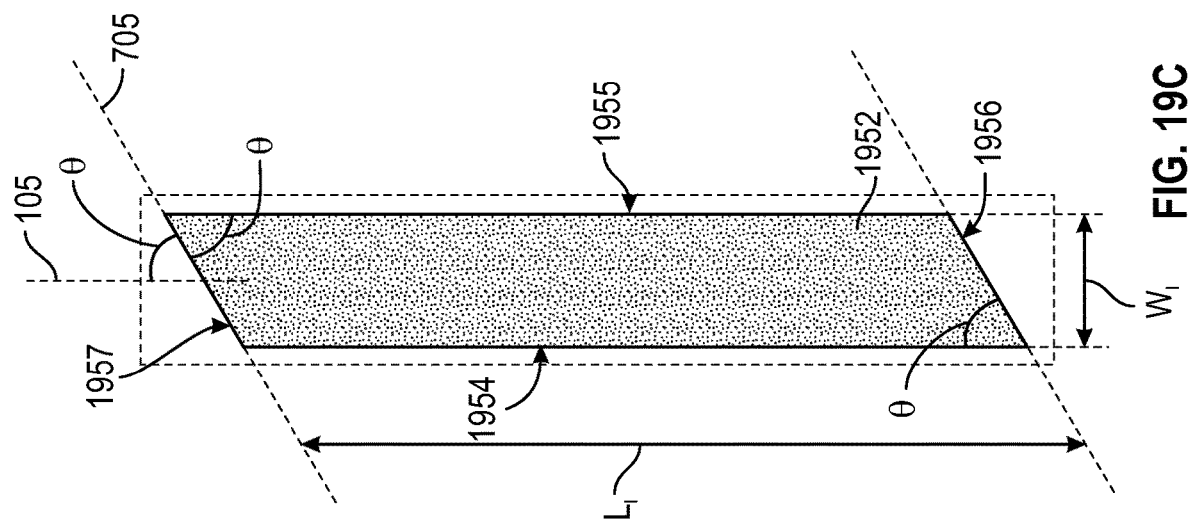
Figure 19B:
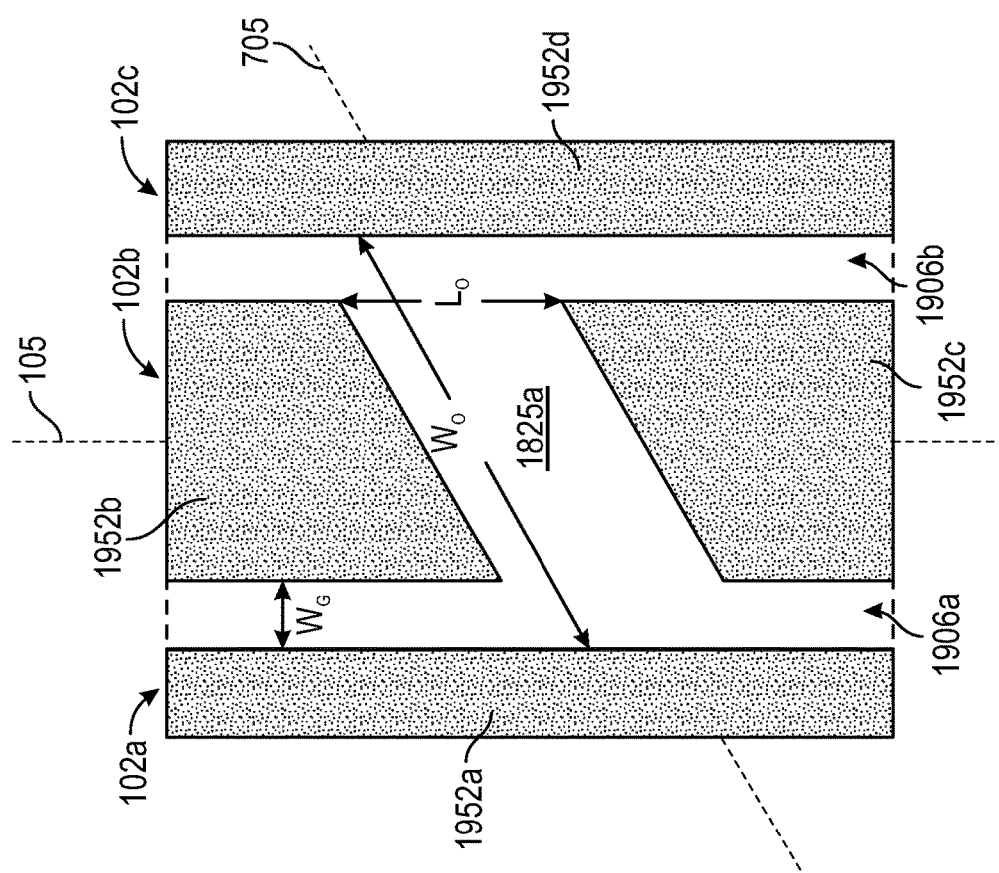

The electronic device 1950 comprises a plurality of first lines 102. Each of the first lines 102 comprises a plurality of elongate islands 1952 having a rhombus-like shape separated by rhombus-like shaped openings 1825. FIG. 19B shows an expanded view of region 19B in FIG. 19A showing a rhombus-like shaped opening 1825, and FIG. 19C shows an expanded view of region 19C in FIG. 19A showing a rhombus-like shaped island 1952. Referring to FIG. 19C, each of the elongate islands 1952 has a first side 1954 opposite a second side 1955 defining a width $W_I$ and a first end 1956 opposite a second end 1957 defining a length $L_I$ extending along the first direction 105. The width WI is measured perpendicular to the first direction 105, as opposed to along the second direction 705. The first end 1956 and second end 1957 are connected by the first side 1954 and second side 1955. The first end 1956 and second end 1957 extend along the second direction 705, and the first side 1954 and second side 1955 extend along the first direction 105. The intersection of the first end 1956 and first side 1954 occurs at an angle T. The skilled artisan will recognize the angular relationship between each of the side and end intersections for any given island 1952 based on conventional geometric norms. To compensate for any rounding of the corners of the islands 1952 from the various processes, the angles are measured as an extrapolation of the sides and ends.

Referring to FIG. 19B, the islands 1952 of each of the first lines 102 are separated from adjacent first lines 102 by a gap 1906 formed along the first direction 105. For example, island 1952a of first line 102a is separated from island 1952b and island 1952c of first line 102b by gap 1906a, and each of islands 1952b and 1952c of first line 102b are separated from island 1952d of first line 102c by gap 1906b. Similar to the width $W_I$ of the islands, the width $W_G$ of the gaps 1906a, 1906b are measured perpendicular to the first direction 105.

Within a given first line 102, each of the elongate islands 1952 are separated from adjacent elongate islands by a rhombus-like shaped opening 1825. For example, in FIG. 19B, island 1952b of first line 102b is separate from island 1952c of first line 102b by rhombus-like shaped opening 1825a. Each opening has a width $W_O$ and a length $L_O$. Unlike the gaps, the width $W_O$ of the opening 1825 is measured along the second direction 705 and the length $L_O$ is measured along the first direction 105, as shown in FIG. 19B.

Figure 20A:
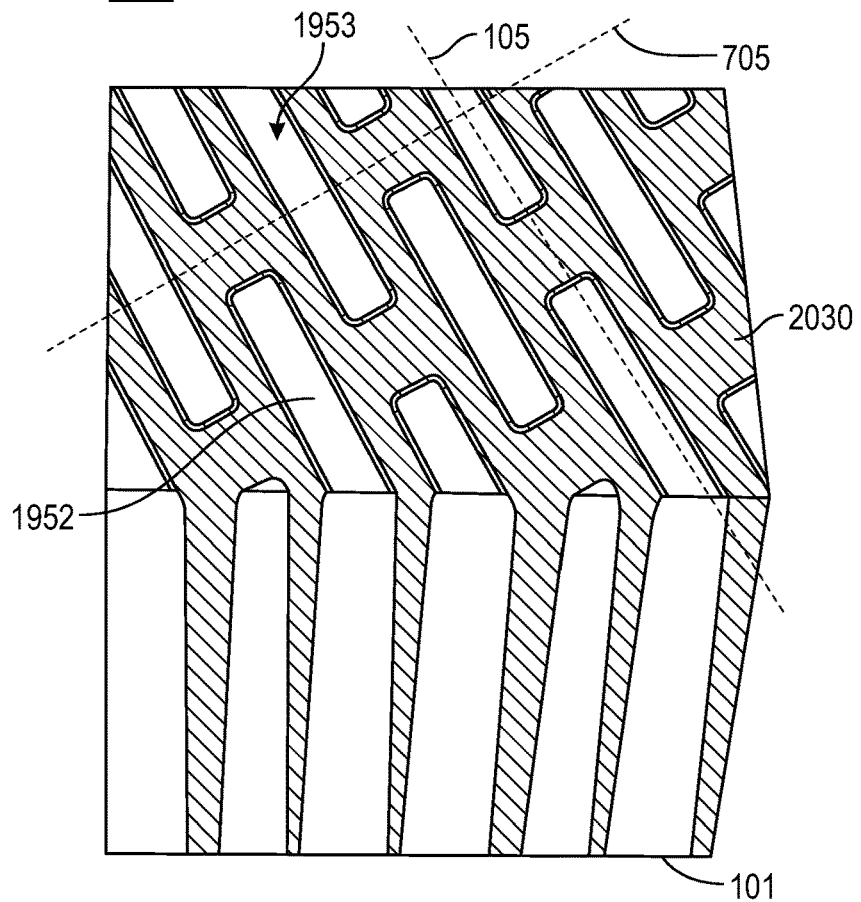
FIG. 20A is a view similar to FIG. 18A, after trench isolation according to one embodiment.
Figure 20B:
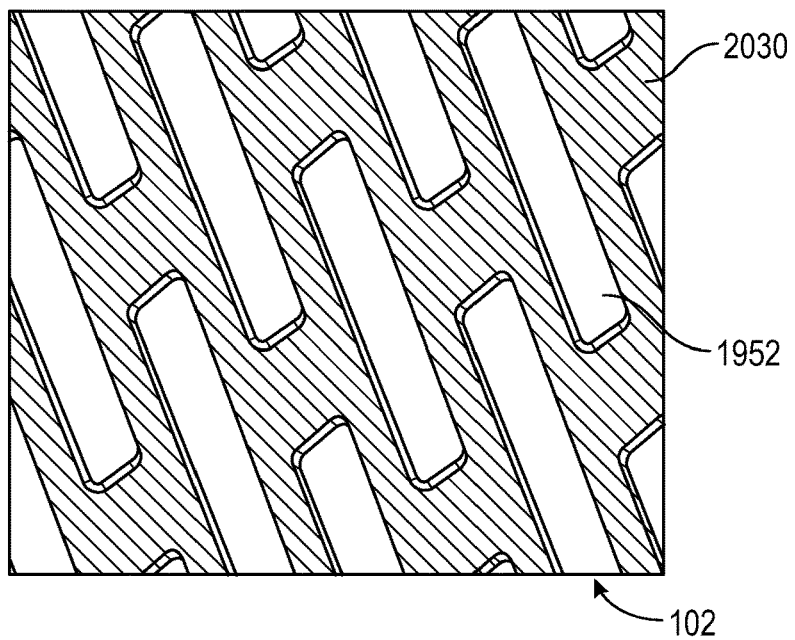
FIG. 20B is a top view of the electronic device structure depicted in FIG. 20A.

FIG. 20A is a view 2000 similar to view 1800 of FIG. 18A, and FIG. 20B is a view 2010 similar to view 1810 of FIG. 18B after deposition of a trench isolation oxide 2030. The trench isolation oxide 2030 has top surface 2031 and is deposited to fill the open spaces between islands 1952. The trench isolation oxide 2030 can be any suitable material deposited by any suitable technique known to the skilled artisan. In some embodiments, the trench isolation oxide 2030 is deposited to form an overburden on the substrate, covering the top 1953 of the islands 1952. After formation of the overburden, a planarization process (e.g., chemical-mechanical planarization (CMP)) can be performed to remove the overburden, reducing the thickness of the trench isolation oxide 2030 and expose the top 1953 of the islands 1952.

Figure 21A:
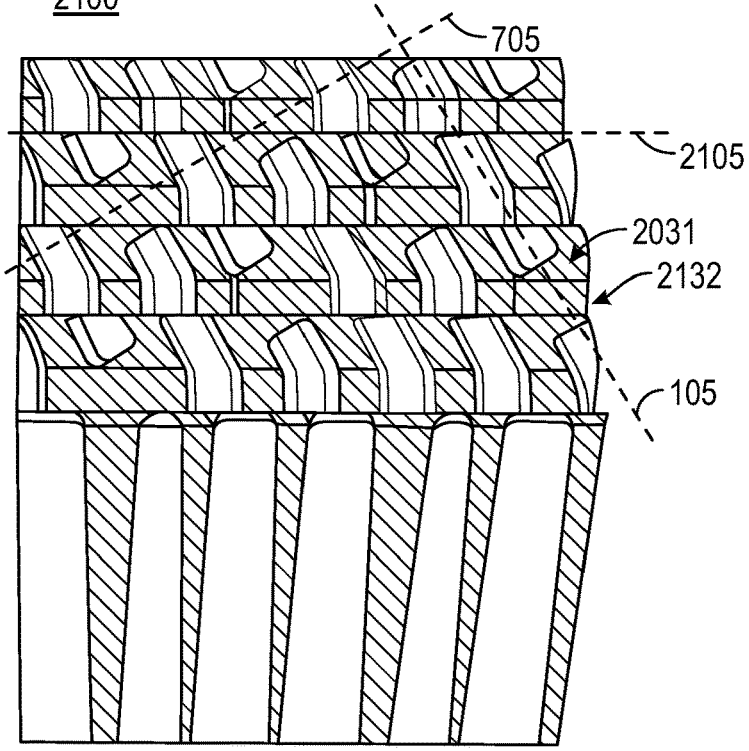
FIG. 21A is a view similar to FIG. 20A, after wordline trench etching according to one embodiment.
Figure 21C:
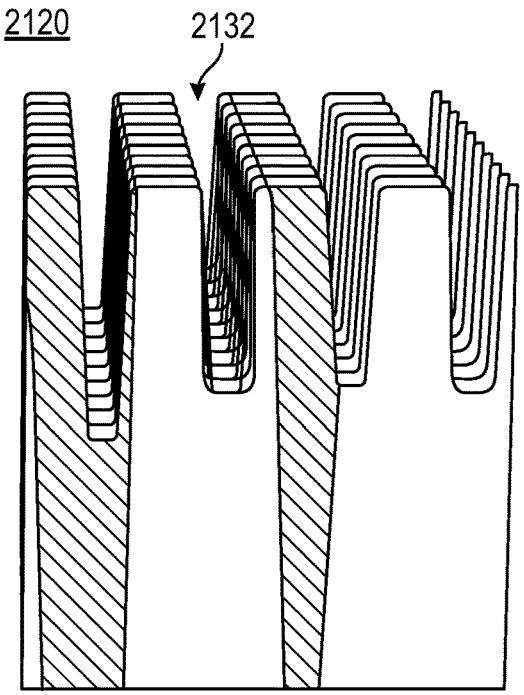
FIG. 21C is a side view of the electronic device structure depicted in FIG. 21A.
Figure 21B:
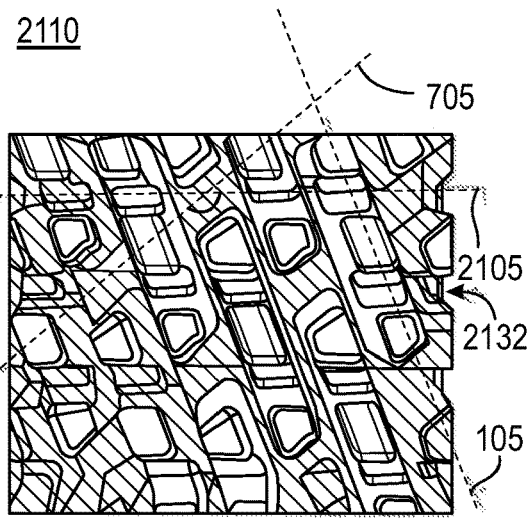
FIG. 21B is a top view of the electronic device structure depicted in FIG. 21A.
Figure 21D:
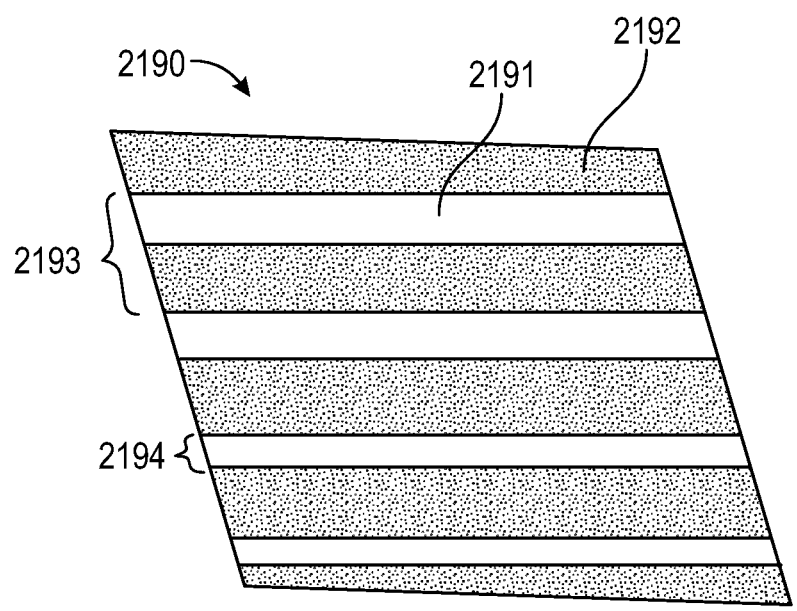
FIG. 21D is a schematic representation of a reticle for patterning the electronic device of FIG. 21A according to one embodiment

FIG. 21A is a view 2100 similar to view 2000 of FIG. 20A, and FIG. 20B is a view 2110 similar to view 2010 of FIG. 20B after formation of wordline trenches 2132 along a third direction 2105. FIG. 21C shows a view 2120 from the left side of FIG. 21A. The wordline trenches 2132 can be formed by any suitable technique known to the skilled artisan. In some embodiments, the worldine trenches 2132 are patterned by a lithographic technique using a fourth reticle 2190, as shown in FIG. 21D. The fourth reticle 2190 has a plurality of open regions 2191 and closed regions 2192 with a third pitch 2193 and third spacing 2194. The fourth reticle 2190 is positioned relative to the substrate so that parts of the substrate 101 with trench isolation oxide 2030 aligned with the open regions 2191 are etched and parts aligned with the closed regions 2192 remain. In some embodiments, the fourth reticle 2190 is positioned relative to the substrate so that parts of the substrate 101 with trench isolation oxide aligned with the closed regions 2192 are etched and parts aligned with the open regions 2191 remain.

In some embodiments, the fourth reticle 2190 has a fourth pitch 2193 in the range of about 5 nm to about 100 nm, or in the range of about 10 nm to about 80 nm, or in the range of about 15 nm to about 60 nm, or in the range of about 20 nm to about 50 nm, or in the range of about 30 nm to about 40 nm. In some embodiments, the fourth reticle 2190 has a fourth spacing 2194 in the range of about 2 nm to about 60 nm, or in the range of about 5 nm to about 40 nm, or in the range of about 15 nm to about 30 nm, or in the range of about 20 nm to about 25 nm. In some embodiments, the third reticle 2190 is the same as the first reticle 390, the second reticle 790 or the third reticle 990 with a different focal length and rotated around an axis normal to the substrate surface.

Figure 22:
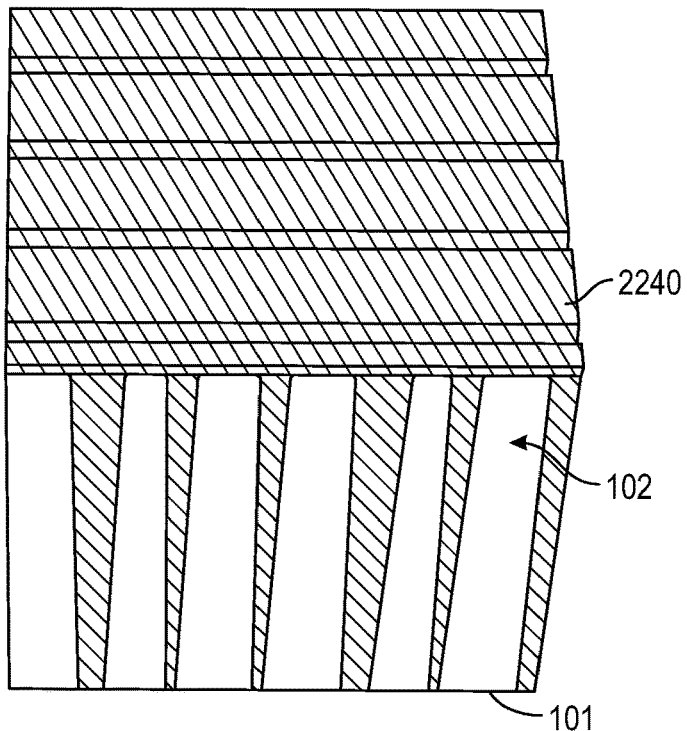
FIG. 22 is a view similar to FIG. 21A, after depositing an ILO-GATOX film according to one embodiment.

FIG. 22 is a view 2200 similar to view 2100 of FIG. 21A after formation of a dielectric 2240 on the surface of the substrate to fill the wordline trenches 2132. In some embodiments, the dielectric 2240 is one or more of an interface layer oxide (ILO) or gate oxide (GATOX). In some embodiments, the dielectric 2240 comprises an interface layer oxide and gate oxide (ILO & GATOX). The dielectric 2240 can be deposited to any suitable thickness. In some embodiments, the dielectric 2240 is sufficiently thin to allow a wordline barrier metal and metallization gap fill process to be used to deposit materials in the worldine trenches 2132. In some embodiments, the dielectric 2240 is deposited as a conformal film having a thickness in the range of about 2 Å to about 30 Å, or in the range of about 5 Å to about 20 Å. In some embodiments, the dielectric 2240 comprises silicon oxide.

In some embodiments, the gate oxide can be any suitable material known to the skilled artisan. The gate oxide can be deposited using one or more deposition techniques known to one of ordinary skill in the art of microelectronic device manufacturing. In one or more embodiments, the gate oxide is deposited using one of deposition techniques, such as, but not limited to, ALD, CVD, PVD, MBE, MOCVD, spin-on, or other deposition techniques known to the skilled artisan. In one or more embodiments, the gate oxide layer comprises a low-K dielectric. In some embodiments, the low-K dielectric is selected from one or more of silicon, silicon oxide, silicon nitride, silicon oxynitride, silicon oxycarbide, silicon oxycarbonitride, doped silicon, doped silicon oxide, doped silicon nitride, doped silicon oxynitride, spin-on dielectrics, or a diffusion species growth. In one or more embodiments, gate oxide layer comprises a silicon oxide.

Figure 23:
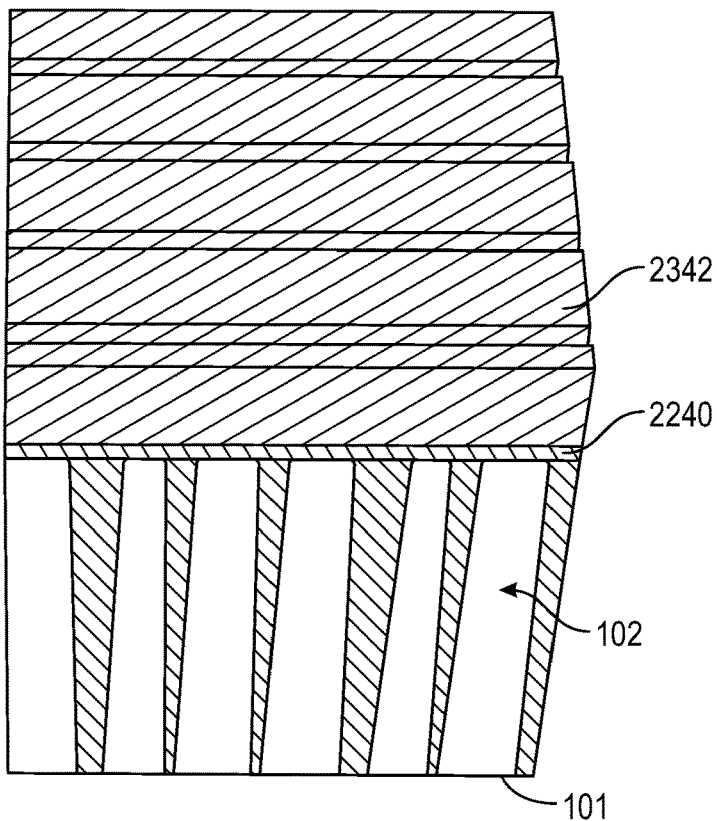
FIG. 23 is a view similar to FIG. 22, after depositing a wordline barrier metal layer and wordline metal layer according to one embodiment.

FIG. 23 is a view 2300 similar to view 2200 of FIG. 22 after deposition of a wordline barrier metal and metal layer 2342 on the dielectric 2240 to fill the wordline trenches 2132. The wordline barrier metal and layer 2342 of some embodiments are separate layers deposited in separate processes. In some embodiments, a single material provides the wordline barrier metal and metal layer 2342. The wordline barrier metal of some embodiments comprises one or more of titanium (Ti), titanium nitride (TiN), tantalum nitride (TaN), or any other suitable barrier metal material. In some embodiments, the wordline barrier metal has a thickness in the range of about 2 Å to about 30 Å, or in the range of about 5 Å to about 25 Å, or in the range of about 10 Å to about 20 Å. In some embodiments, the wordline barrier metal is deposited to a thickness sufficient to form a continuous film.

In some embodiments, forming the wordline barrier metal and metal layer 2342 involves filling the wordline trenches 2132 with a layer of conductive material. The layer of conductive material is also referred to as the wordline barrier metal and is not illustrated separately. In one embodiment, a base layer (also referred to as the wordline barrier metal) of the conductive material is first deposited in the worldline trenches 2132, and then the conductive layer (also referred to as a metal layer) is deposited on the base layer. In one embodiment, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material into the dielectric 2240. Additionally, the conductive barrier layer can be used to provide adhesion for the seed layer (e.g., copper).

In one embodiment, to form the base layer, the conductive barrier layer is deposited onto the sidewalls and bottom of the wordline trenches 2132, and then the seed layer is deposited on the conductive barrier layer. In another embodiment, the conductive base layer includes the seed layer that is directly deposited onto the sidewalls and bottom of the wordline trenches 2132. Each of the conductive barrier layer and seed layer may be deposited using any think film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In one embodiment, the barrier layer may be a thin dielectric that has been etched to establish conductivity to the metal layer below. In one embodiment, the barrier layer may be omitted altogether and appropriate doping of the metal layer may be used to make a "self-forming barrier".

In some embodiment, the choice of a material for metal layer determines the choice of a material for the seed layer. For example, if the material for the metal layer includes copper, the material for the seed layer also includes copper. In one embodiment, the metal layer includes a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In alternative embodiments, examples of the conductive materials that may be used for the metal layer of the barrier metal and metal layer 2342 are, for example, metals, e.g., copper (Cu), tantalum (Ta), tungsten (W), ruthenium (Ru), titanium (Ti), hafnium (Hf), zirconium (Zr), aluminum (Al), silver (Ag), tin (Sn), lead Pb), metal alloys, metal carbides, e.g., hafnium carbide (HfC), zirconium carbide (ZrC), titanium carbide (TiC), tantalum carbide (TaC), aluminum carbide (AlC), other conductive materials, or any combination thereof.

FIG. 24A is a view 2400 similar to view 2300 of FIG. 23. FIG. 24B is a top view of the embodiment of FIG. 24A, and FIG. 24C is a side view of the embodiment of FIG. 24A (looking at the left side oriented relative to the page). The wordline barrier metal and metal layer 2342 and the dielectric 2240 have been removed or recessed to expose the tops 2453 of the islands 2452 and create conductive wordlines 2442 separated by dielectric 2440. The removal or recessing process can be any suitable process known to the skilled artisan, including, but not limited to, etching or chemical-mechanical planarization.

In one or more embodiments, the dielectric 2240 is deposited using any deposition technique known to one of skill in the art, such as, but not limited to, ALD, CVD, PVD, MBE, MOCVD, spin-on, shallow trench isolation (STI), or other deposition techniques known to the skilled artisan. In one or more embodiments, the dielectric 2240 forms an overburden (not illustrated) when deposited, and the overburden may be removed by any technique known to one of skill in the art, including, but not limited to chemical mechanical polishing (CMP), planarization, and the like. When the overburden is removed, the top surface of the dielectric 2240 is substantially coplanar with the top surface of the substrate 101.

As used in this manner, "substantially coplanar" means that the plane formed by the top surface of the dielectric 2240 is within ±5°, ±4°, ±3°, ±2° or ±1° of the plane formed by the top surface of the substrate 101. In some embodiments, the term "substantially coplanar" means that the planes formed plane formed by the top surface of the dielectric 2240 is within ±10 nm, ±5 nm, ±2.5 nm, ±1 nm or ±0.5 nm of the plane formed by the top surface of the substrate 101.

As used herein, the term "dielectric" refers to a layer of material that is an electrical insulator that can be polarized in an electric field. In one or more embodiments, the dielectric layer comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the dielectric includes, without limitation, furnace, CVD, PVD, ALD and spin-on-coat (SoC) deposited films. In one or more embodiments, the dielectric may be exposed to in-situ or ex-situ pretreatment and post-treatment process to dope, infuse, implant, heat, freeze, polish, etch, reduce, oxidize, hydroxylate, anneal, UV cure, e-beam cure and/or bake the surface or bulk of the dielectric. In addition to film processing directly on the surface of the dielectric itself, in one or more embodiments, any of the film processing steps disclosed may also be performed on an underlayer formed on the dielectric, and the term "dielectric surface" is intended to include such underlayer as the context indicates. Thus, for example, where a film/layer or partial film/layer has been deposited onto a dielectric surface, the exposed surface of the newly deposited film/layer becomes the dielectric surface.

Figure 24D:
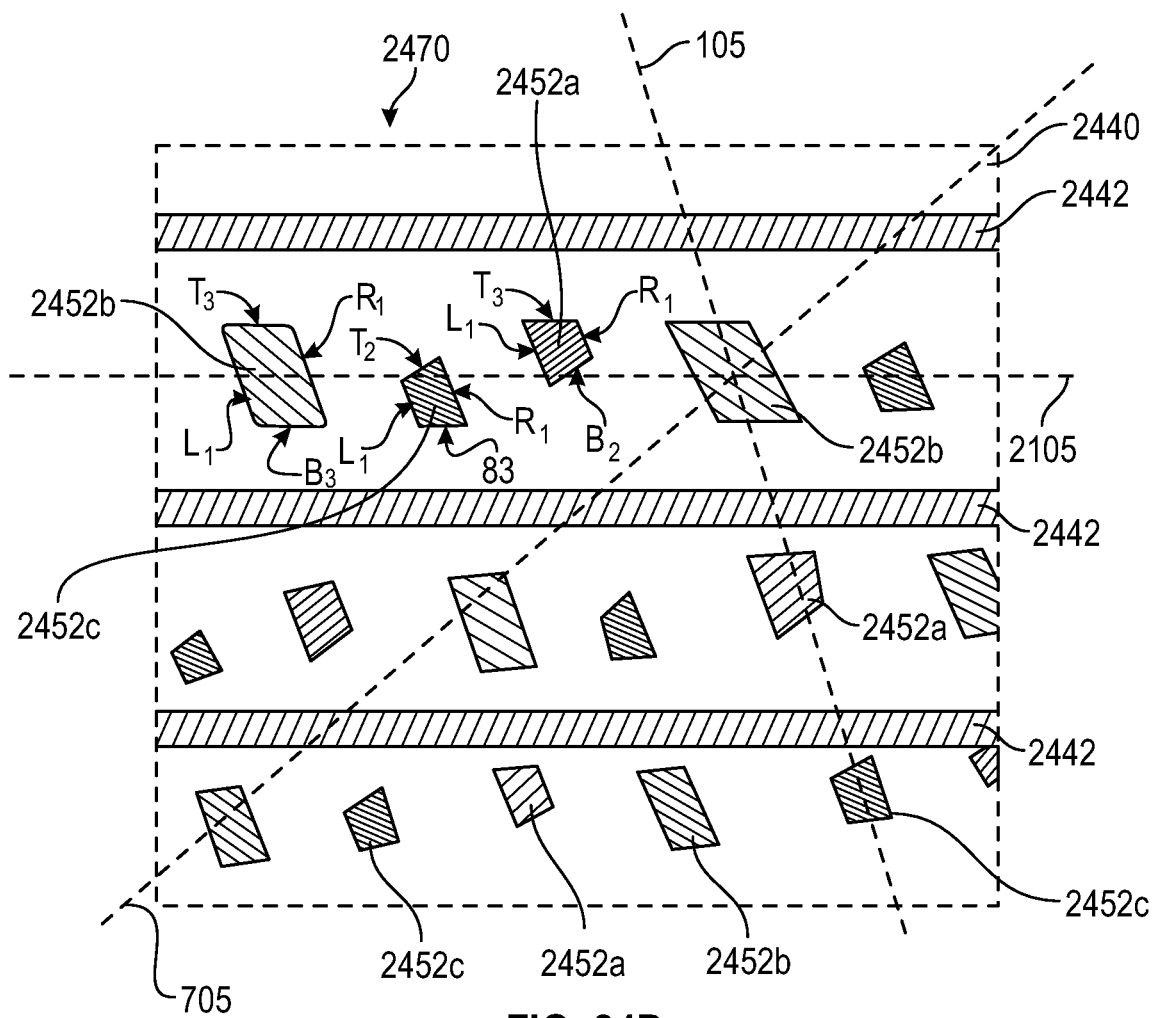
FIG. 24D is a partial schematic view of a top of the electronic device structure depicted in FIG. 24A.

The process described herein results in a novel arrangement of islands 2452 between wordlines 2442. FIG. 24D shows a top view of a portion of the electronic device 2470 with islands 2452 and wordlines 2442. The islands 2452 have three different shapes; a left-facing trapezoid-like shaped island (LTI) 2452a, rhobus-like shaped island (RI) 2452b, and a right-facing trapezoid-like shaped island (RTI) 2452c. As used in this manner, a trapezoid "faces" the direction with the wider of the parallel sides. For descriptive purposes, the sides of the various shaped islands 2452 are referred to as left, right, top and bottom. The skilled artisan will recognize that these orientations are merely based on the Figure orientation on the page and do not specify any particular spatial orientation.

As used in this manner, the term "trapezoid-like", "trapezoidal", and similar, means a shape having two parallel sides connected by two angled sides where the angled sides are angled at directions, relative to the longer side, on opposite sides of a normal to the longest parallel side. As used in this manner, the term "rhombus-like", "rhomboid", "rhomboid-like", and similar, refer to a shape have two parallel sides connected by two different parallel sides, where one set of the parallel sides is parallel to the third direction and the other set of parallel sides is parallel to the first direction. The skilled artisan will recognize that the overall shape of the island is being referred to and that there are expended deviations from straight sides and curved angles and corners.

Some embodiments of the disclosure are directed to electronic devices 2470 having a plurality of spaced wordlines 2442 and substrate islands 2452. The plurality of spaced wordlines 2442 define a third direction 2105. Each of the wordlines 2442 are spaced from adjacent wordlines 2442 by a dielectric 2440. The plurality of substrate islands 2452 within the dielectric 2440 extend in a first direction 105, second direction 705 and third direction 2105. The islands 2452 comprise trapezoid-like shaped islands (TI) 2452b, right-facing rhombus-like islands (RFI) 2452c and left-facing rhombus-like islands (LFI) 2452a. The islands 2452 are arranged in repeating patterns along the first direction 105, the second direction 705 and the third direction 2105. In the first direction 105 and the third direction 2105, the islands 2452 form a repeating pattern of TI 2452b, RFI 2452c and LFI 2452a, respectively. Along the second direction 705, the islands 2452 appear as a plurality of lines of a single type to form lines of TI 2452b, lines of RFI 2452c and lines of LFI 2452a.

Referring to FIG. 24D, in some embodiments, the trapezoid-like shaped island (TI) 2452b has four sides: a left side that lies in the first direction (L1), a right side that lies in the first direction (R1), a top side that extends in the third direction (T3) and a bottom side that extends in the third direction (B3). For descriptive purposes, side labels L, R, T and B refer to left, right, top and bottom, respectively. The number after the side label refers to the direction that the side is parallel with so that 1, 2 and 3 refer to the first direction, second direction and third direction, respectively. In some embodiments, the left-facing rhombus-like islands 2452a have side labels T2, B3, R1, L1. In some embodiments, the right-facing rhombus-like islands 2452c have side labels T3, B2, R1, L1. In some embodiments, not all of the islands have one of the trapezoidal or rhomboid shapes due to misalignment of the masks during processing. In embodiments of this sort, at least some of the lines of islands are TI, LFI or RFI.

Figure 24E:
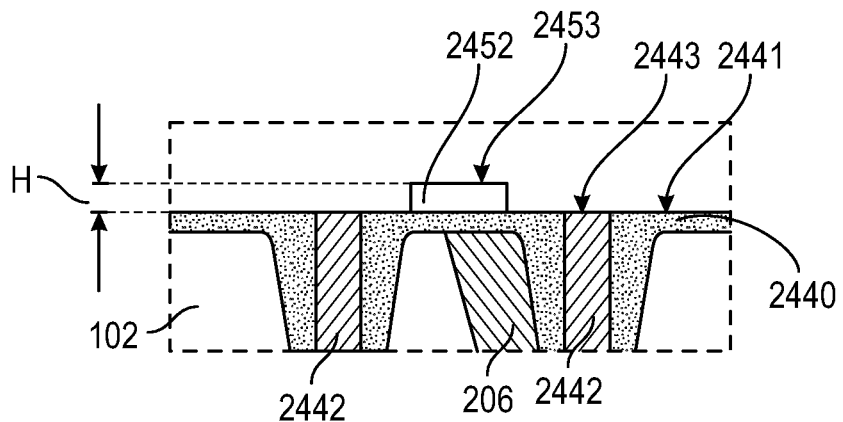
FIG. 24E is a partial schematic view of a side of the electronic device structure depicted in FIG. 24A.

In some embodiments, as shown in FIG. 24E the islands 2452 have a top surface 2453 that is higher than the top surface 2443 of the wordline 2442 or the top surface 2441 of the dielectric 2440. The height H above the surfaces 2441, 2443 can be controlled by selective etching of the dielectric 2440 and/or wordline 2442, or by other techniques known to the skilled artisan. In some embodiments, the height H above the surfaces 2441, 2443 is in the range of about 0.1 Å to about 50 Å, or in the range of about 0.2 Å to about 30 Å, or in the range of about 0.3 Å to about 25 Å. In some embodiments, the height H is greater than or equal to about 0.1 Å, 0.2 Å, 0.3 Å, 0.4 Å or 0.5 Å, and/or less than or equal to about 50 Å, 40 Å, 30 Å, 25 Å or 20 Å.

FIG. 25A is a view 2500 similar to view 2400 of FIG. 24A, FIG. 25B is a view 2510 similar to view 2410 of FIG. 24B, and FIG. 25C is a view 2520 similar to view 2420 of FIG. 24C etching the dielectric 2440 and wordline 2442 into the wordline trenches 2132. Etching lowers the top surface 2441 of the dielectric 2440 and top surface 2443 of the wordline 2442 to a depth D below the top surface 2031 of dielectric 2030. In some embodiments, the depth D is in the range of about 5 nm to about 100 nm, or in the range of about 10 nm to about 80 nm, or in the range of about 20 nm to about 60 nm, or in the range of about 30 nm to about 40 nm.

Figure 26:
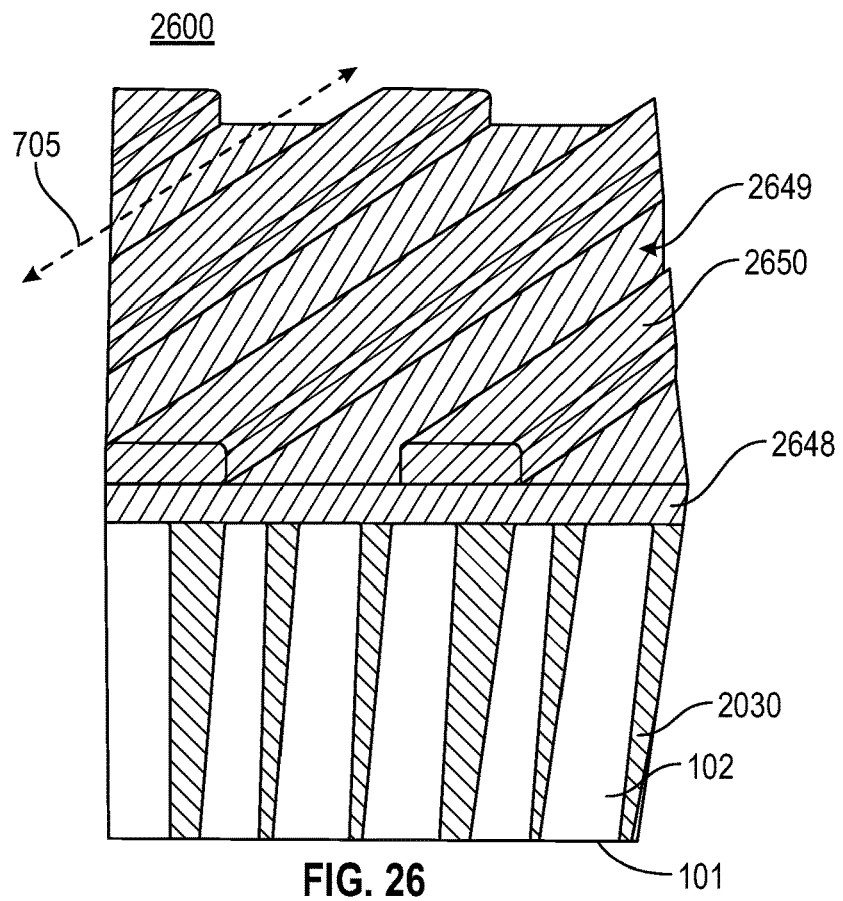
FIG. 26 is a view similar to FIG. 25A, after depositing an insulator and patterned sixth hardmask according to one embodiment.

FIG. 26 is a view 2600 similar to view 2500 of FIG. 25A, after deposition of a gapfilling insulator 2648 and patterning of a sixth hardmask 2650. A gapfilling insulator 2648 is deposited into the wordline trench 2132 and planarized to provide a flat top surface 2649. The gapfilling insulator can be any suitable material. In some embodiments, the gapfilling insulator 2132 comprises silicon nitride (SiN). As used in this specification, the chemical formulae for material compositions are not intended to imply specific stoichiometric relationship. Rather, the formulae convey only the identity of the primary components of the film, not including impurities. A SiN film may also be called a silicon nitride film, an $S_3N_4$ film, and the like; but means that the film has silicon and nitrogen as the primary atomic components.

A sixth hardmask 2650 is deposited on the top surface 2649 of the insulator 2648. The sixth hardmask 2650 can be any suitable material that is etch selective with later deposited hardmasks. The sixth hardmask 2650 of some embodiments is the same material as one of the first hardmask, second hardmask, third hardmask, fourth hardmask or fifth hardmask material.

The sixth hardmask 2650 is patterned by lithographic techniques using the second reticle 790 (see FIG. 7D). By reusing the same reticle, overlay misalignments can be minimized or avoided and transfers the Active MCC pattern to the bit line contact (BLC). The sixth hardmask 2650 is patterned into lines and trenches extending along the second direction 705.

Figure 27:
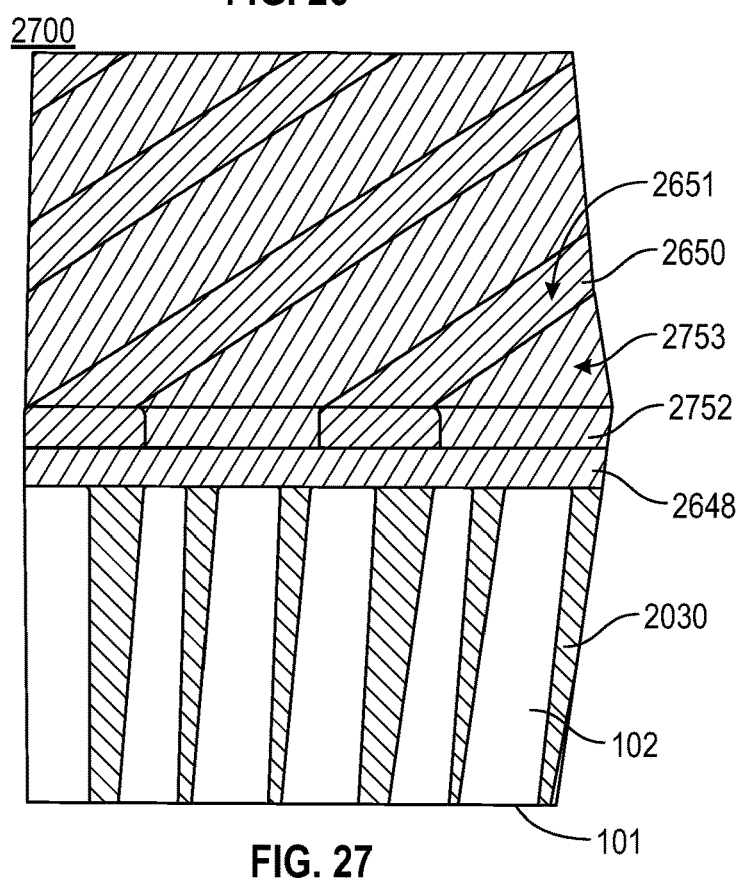
FIG. 27 is a view similar to FIG. 26, after depositing a seventh hardmask and planarizing according to one embodiment.

FIG. 27 is a view 2700 similar to view 2600 of FIG. 26 after depositing a seventh hardmask 2752 on the top surface 2649 of the insulator 2648. The top surface 2653 of the seventh hardmask 2652 is even with the top surface 2651 of the sixth hardmask 2650. In some embodiments, the seventh hardmask 2752 is deposited to form an overburden followed by planarization.

Figure 28:
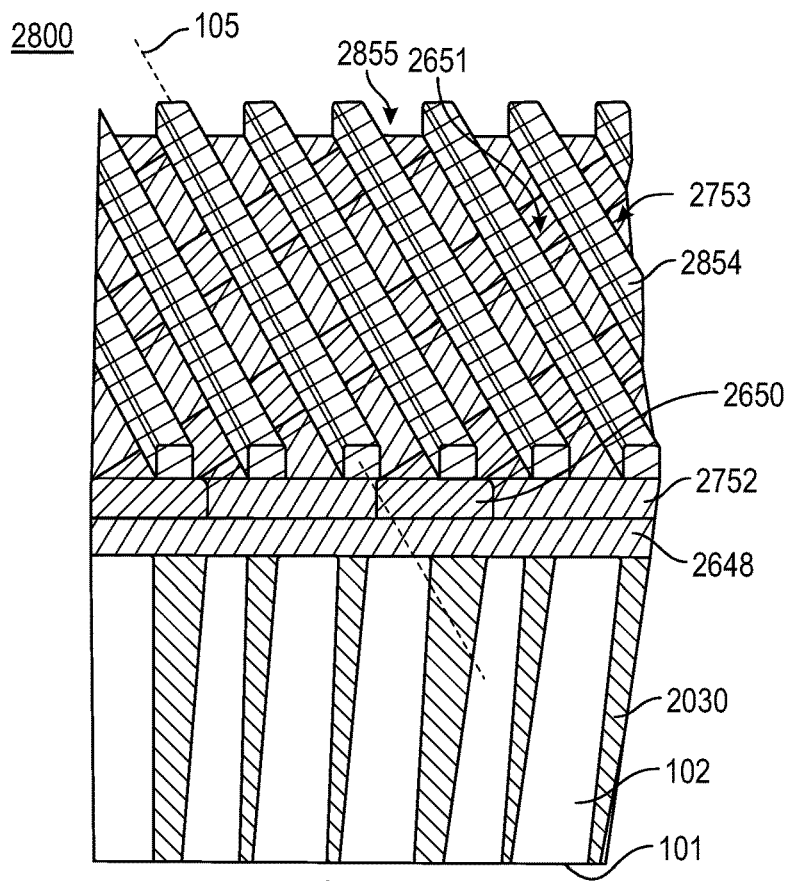
FIG. 28 is a view similar to FIG. 27, after depositing a patterned eighth hardmask according to one embodiment.

FIG. 28 is a view 2800 similar to FIG. 27 depositing and patterning an eighth hardmask 2854. The eighth hardmask 2854 is etch selective relative to the sixth hardmask 2650 and seventh hardmask 2652. The eighth hardmask 2854 is patterned by lithography using the first reticle 390 (see FIG. 3C). The eight hardmask 2854 pattern exposes the top surface 2651 of the sixth hardmask 2650 and the top surface 2753 of the seventh hardmask 2752 in lines extending along the first direction 105.

Figure 29:
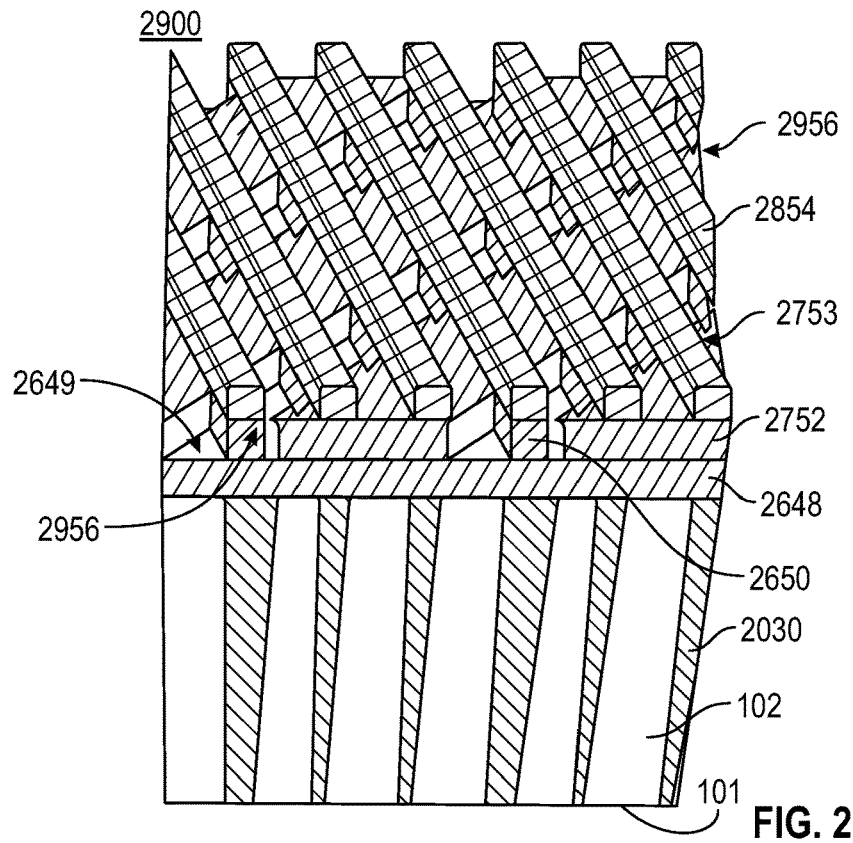
FIG. 29 is a view similar to FIG. 28, after selectively etching the sixth hardmask according to one embodiment.

FIG. 29 is a view 2900 similar to view 2800 of FIG. 28 after selectively etching the sixth hardmask 2650 through openings 2855 in the patterned eight hardmask 2854. The etch process is selective for the sixth hardmask 2650 relative to the seventh hardmask 2752, eighth hardmask 2854 and insulator 2648. The etch process is anisotropic and exposes the top surface 2649 of the insulator 2648 through holes 2956.

Figure 30:
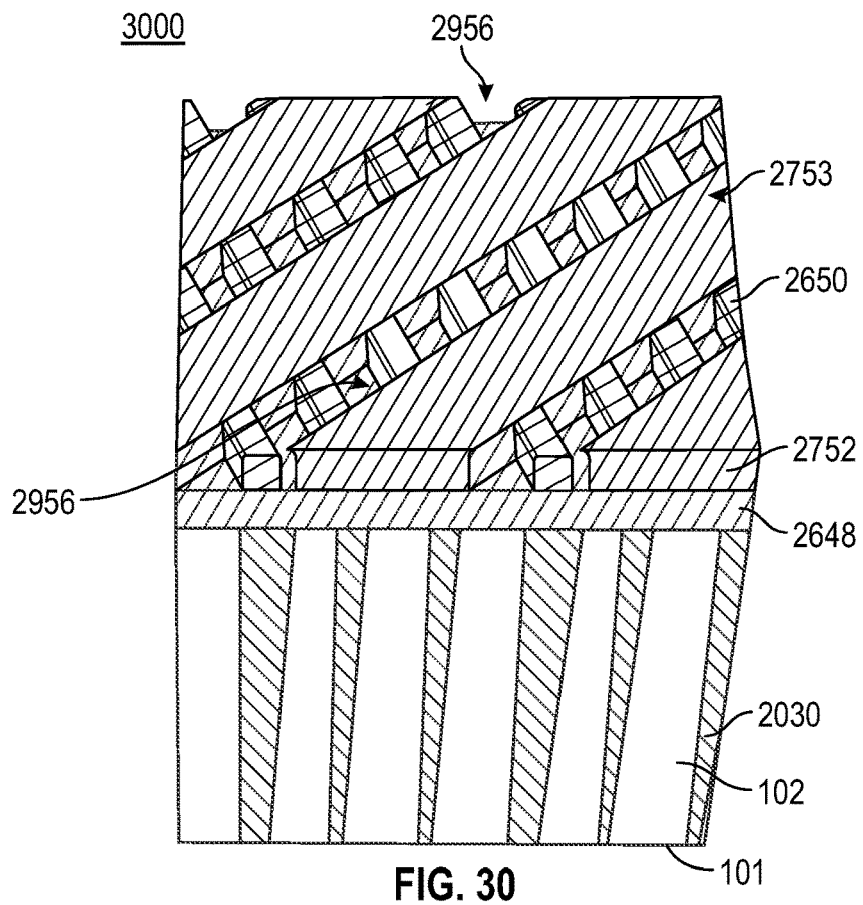
FIG. 30 is a view similar to FIG. 29, after removing the eighth hardmask according to one embodiment.

FIG. 30 is a view 3000 similar to view 2900 of FIG. 29 after removing the eighth hardmask 2854. The eighth hardmask 2854 can be removed by any suitable technique known to the skilled artisan including, but not limited to, planarization (CMP) and selective etching.

Figure 31A:
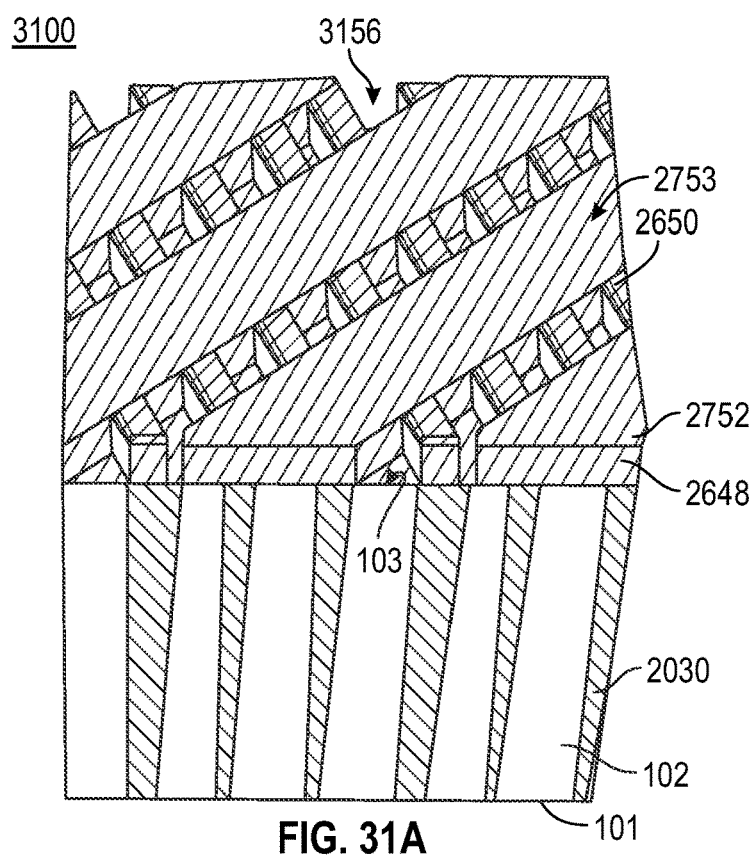
FIG. 31A is a view similar to FIG. 30, after selectively etching the insulator according to one embodiment.
Figure 31B:
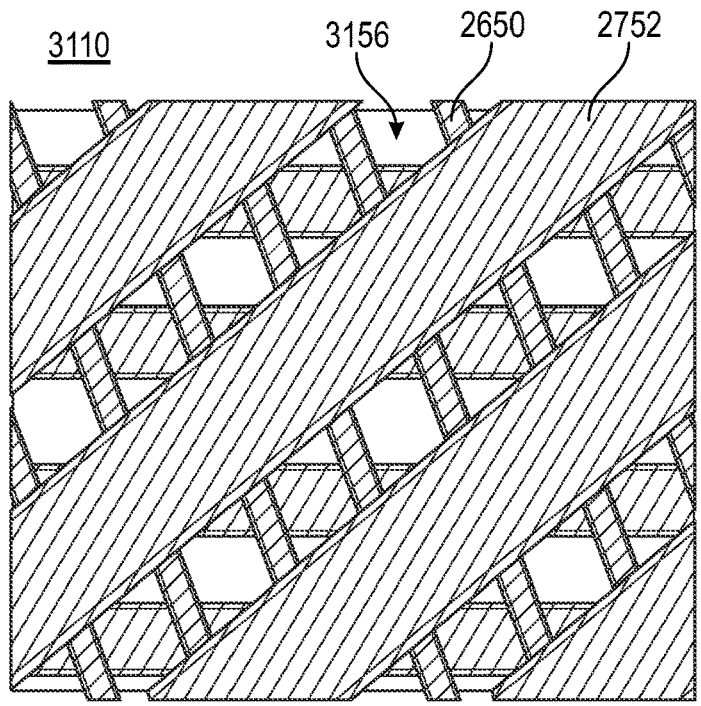
FIG. 31B is a top view of the electronic device structure depicted in FIG. 31A.

FIG. 31A is a view 3100 similar to view 3000 of FIG. 30. FIG. 31B is a top view 3110 of FIG. 31A. FIGS. 31A and 31B show the electronic device of FIG. 30 after the insulator 2648 has been etched through the sixth hardmask 2854 and seventh hardmask 2752 to expose the top surface 103 of the substrate 102 through openings 3156. The etch process is anisotropic and selective for the insulator 2648 to stop at the substrate 101.

Figure 32:
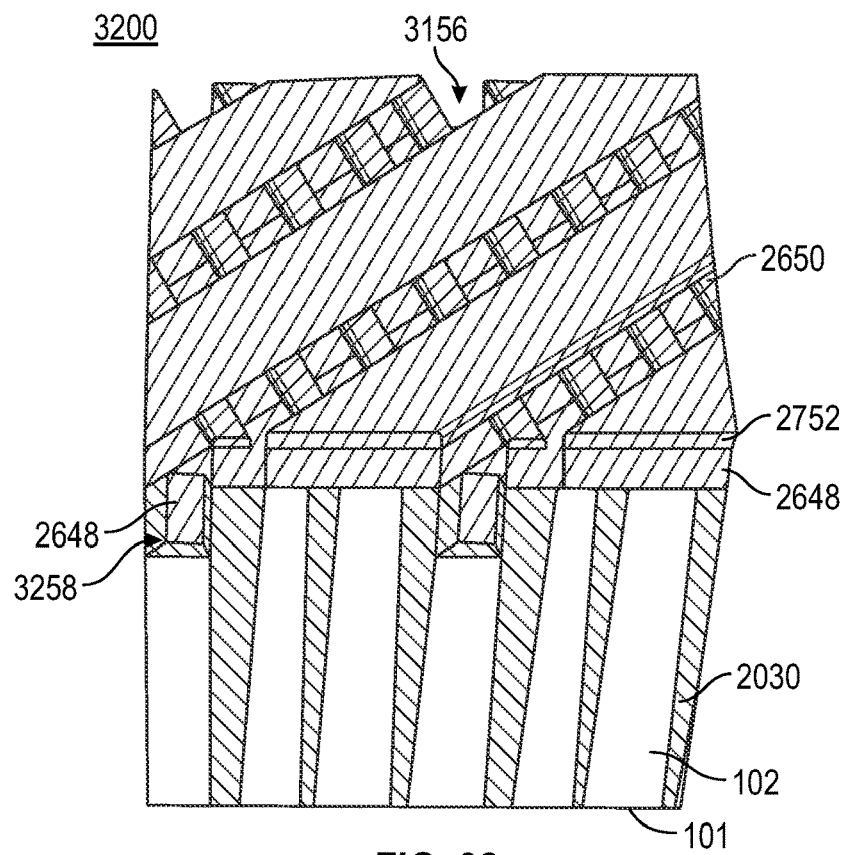
FIG. 32 is a view similar to FIG. 31A, after etching the substrate according to one embodiment.

FIG. 32 is a view 3200 similar to view 3100 of FIG. 31A after anisotropically etching the substrate 101 through the openings 3156 in the hardmasks.

Figure 33A:
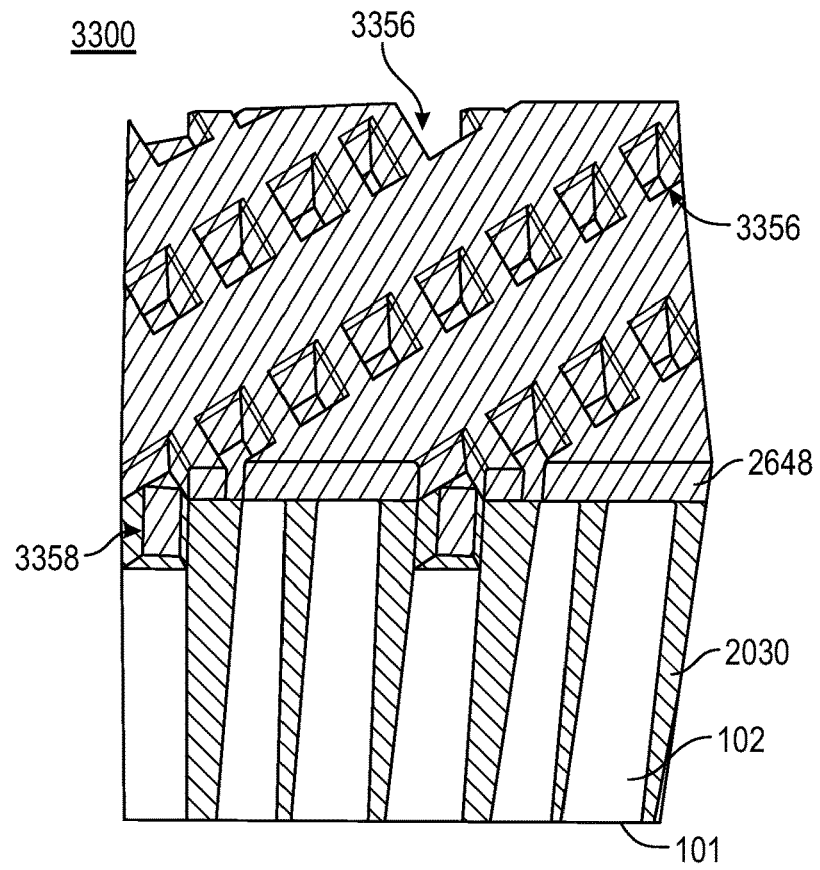
FIG. 33A is a view similar to FIG. 32, after removing the sixth and seventh hardmasks according to one embodiment.
Figure 33B:
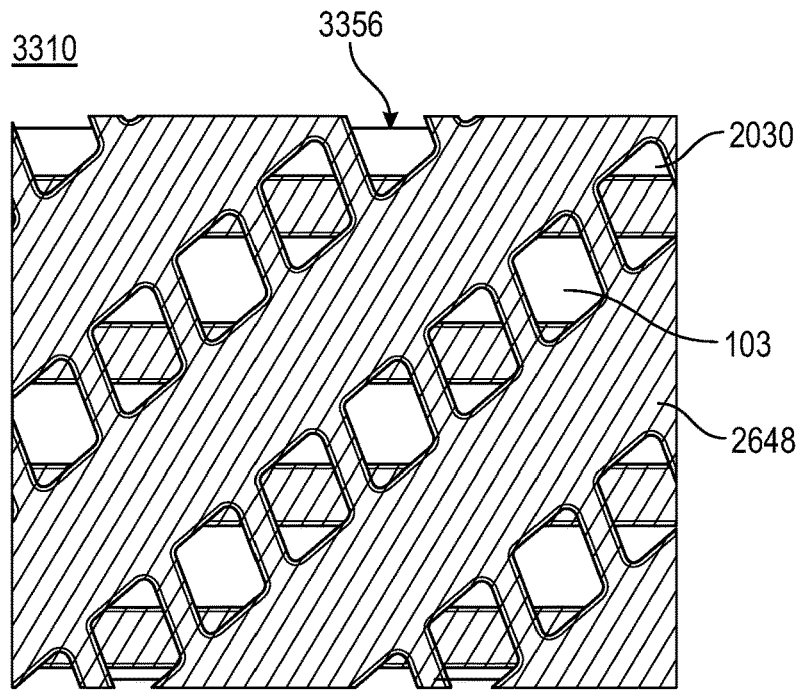
FIG. 33B is a top view of the electronic device structure depicted in FIG. 33A.

FIG. 33A is a view 3300 similar to view 3200 of FIG. 32, and FIG. 33B is a top view of FIG. 33A after selectively removing the sixth hardmask 2650 and seventh hardmask 2753. The sixth hardmask 2650 and seventh hardmask 2753 can be removed in a single process that is selective to both materials or can be separate processes performed in the same or different processing chambers. Removal of the sixth and seventh hardmasks can be a selective etch or ashing process that results in an insulator with a plurality of rhombus-shaped openings 3356. The plurality of openings 3356 are arranged in a line along the second direction 705. The openings 3356 have two parallel sides aligned along the first direction 105 and two parallel sides aligned along the second direction.

Figure 34A:
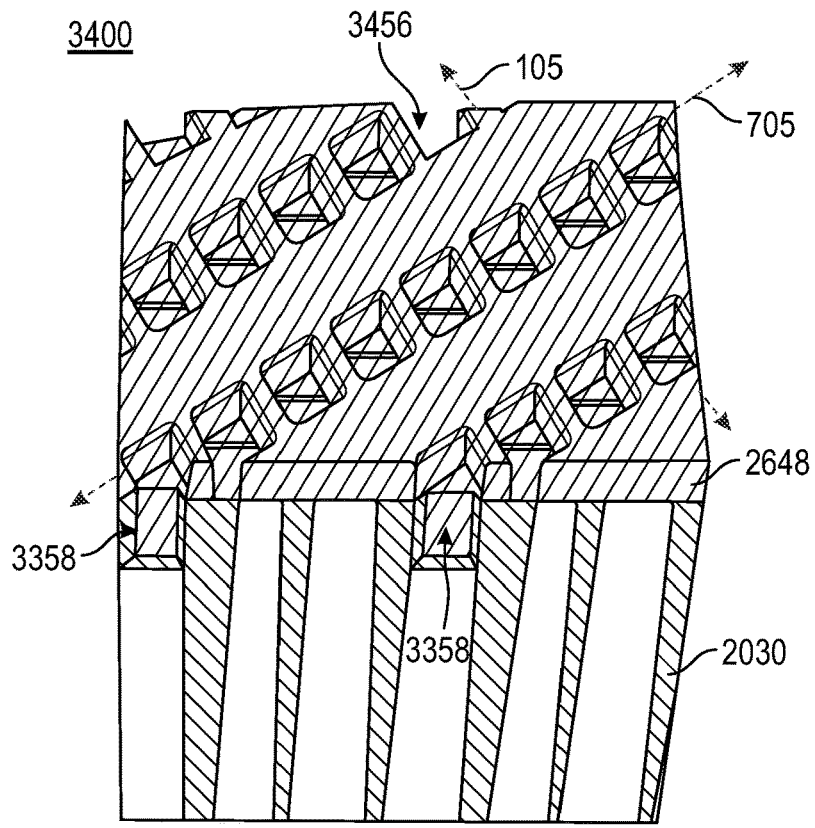
FIG. 34A is a view similar to FIG. 33A, after insulator trim and push process according to one embodiment.
Figure 34B:
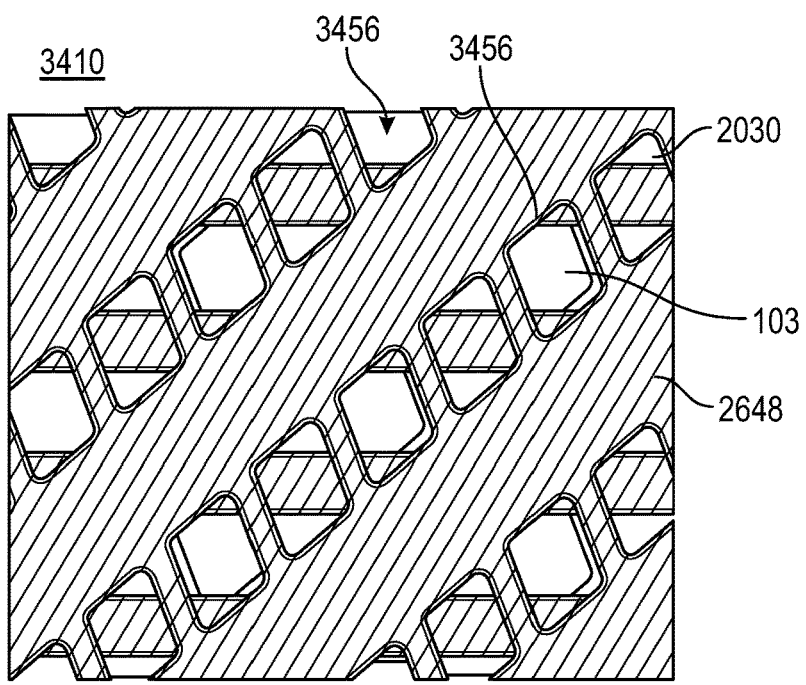
FIG. 34B is a top view of the electronic device structure depicted in FIG. 34A.

FIG. 34A is a view 3400 similar to view 3300 of FIG. 33A, and FIG. 34B is a view 3410 similar to view 3310 of FIG. 33B after an insulator push process. The plurality of openings 3356 are pushed in an etch process to increase likelihood that the bitline contact with cover the active substrate area. The openings 3356 are widened to form openings 3456.

Figure 35:
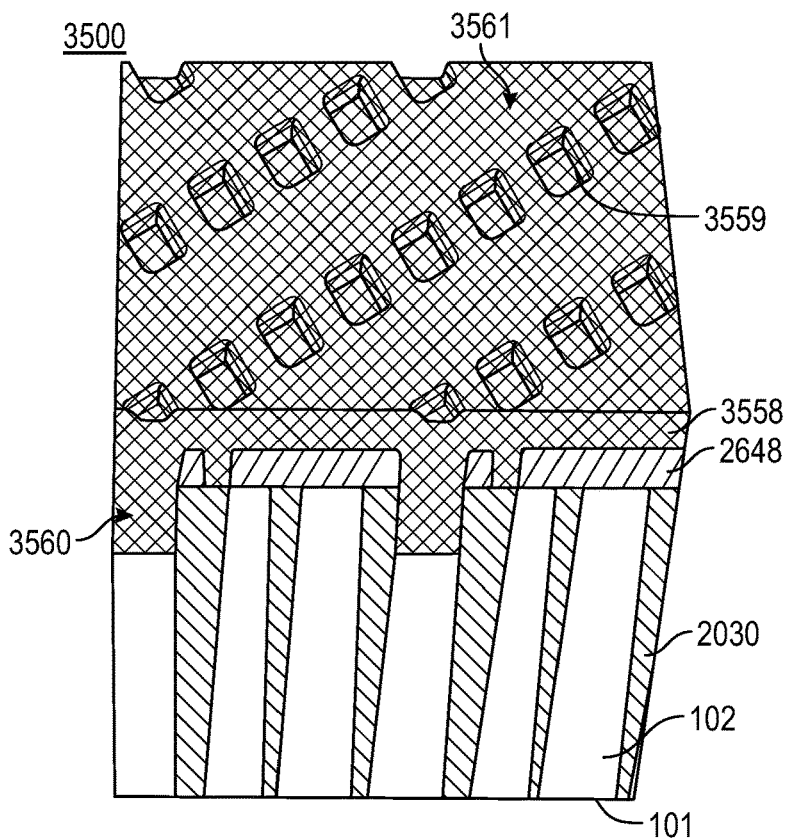
FIG. 35 is a view similar to FIG. 34A, after depositing a silicon/polysilicon layer according to one embodiment.

FIG. 35 is a view 3500 similar to view 3400 of FIG. 34A after epitaxially growing a bit-line contact of silicon/polysilicon 3558 on the insulator 2648. The openings 3456 in the insulator 2648 are filled with the silicon/polysilicon 3558 leaving dimpled areas 3559 in the top surface 3561 and portions 3560 of the silicon/polysilicon 3558 in direct contact with the substrate 101.

Figure 36:
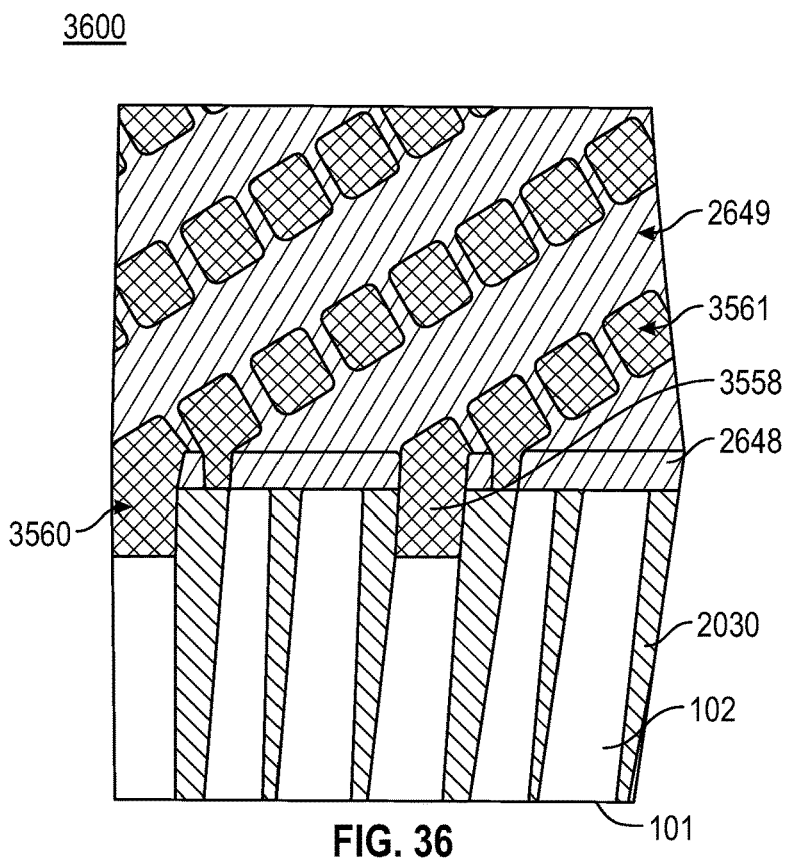
FIG. 36 is a view similar to FIG. 35, after planarizing according to one embodiment.

FIG. 36 is a view 3600 similar to view 3500 of FIG. 35 after planarizing the silicon/polysilicon 3558 to make the top surface 2649 of the insulator 3648 coplanar with the top surface 3561 of the silicon/polysilicon 3558.

Figure 37A:
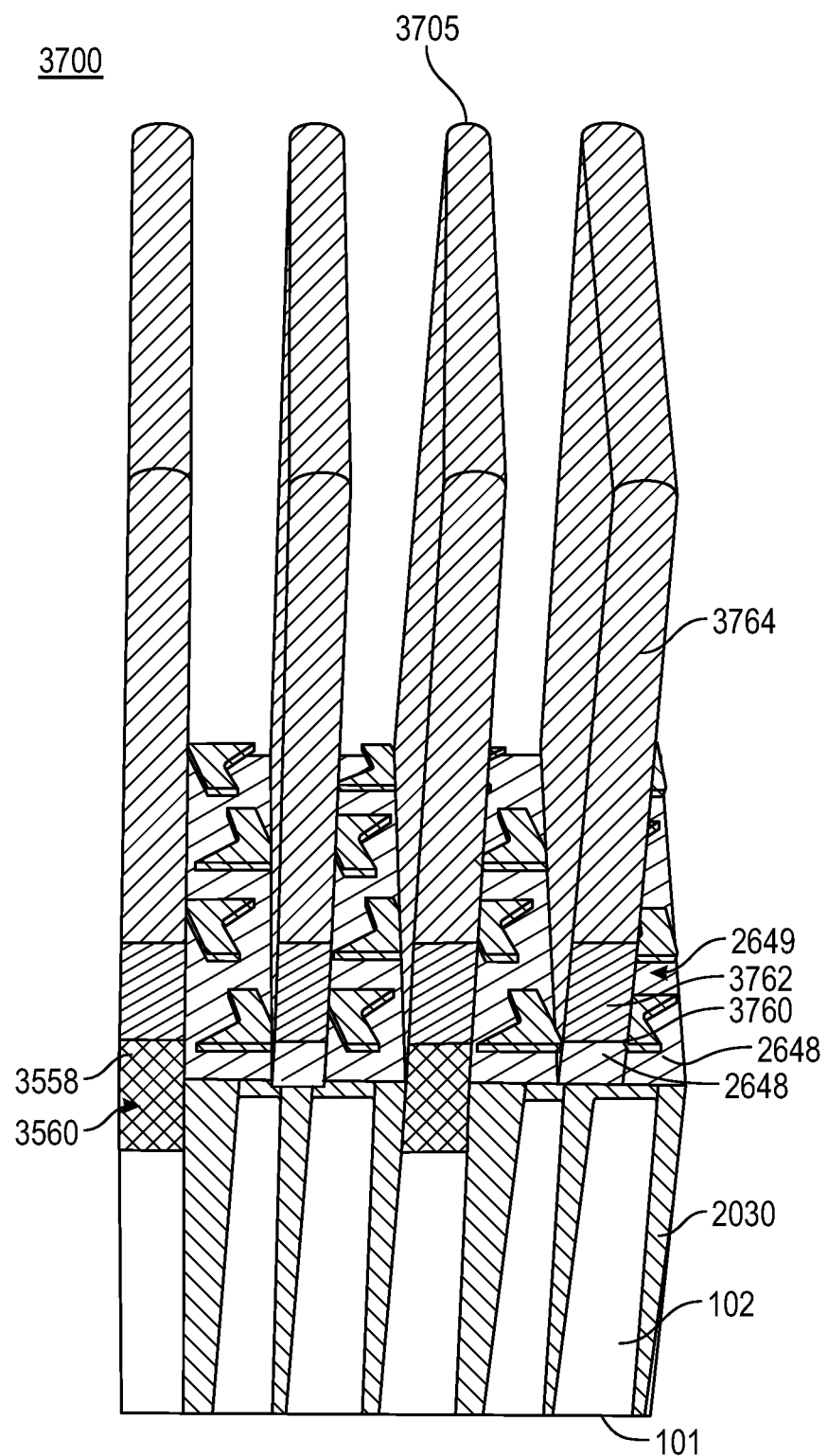
FIG. 37A is a view similar to FIG. 36, after forming a patterned insulator/bitline metal/bitline barrier metal/silicon/polysilicon/insulator stack according to one embodiment.
Figure 37B:
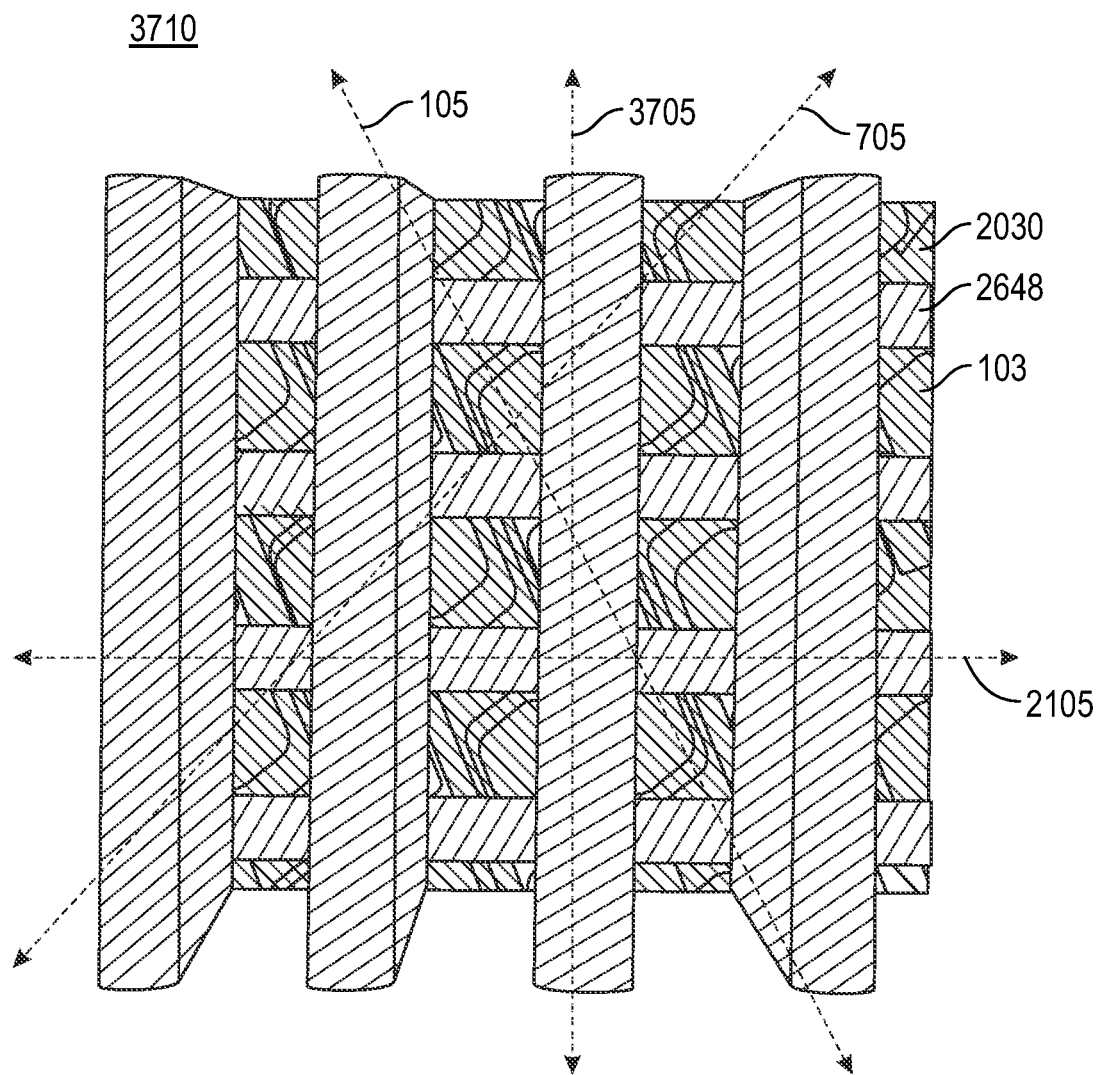
FIG. 37B is a top view of the electronic device structure depicted in FIG. 37A.

FIG. 37A is a view 3700 similar to view 3600 of FIG. 36 and FIG. 37B is a top view 3710 of FIG. 37A after deposition of a bitline barrier metal layer 3760, a bitline metal layer 3762 and an insulator 3764 followed by patterning. The patterning process creates gaps aligned along a fourth direction 3705.

Figure 38A:
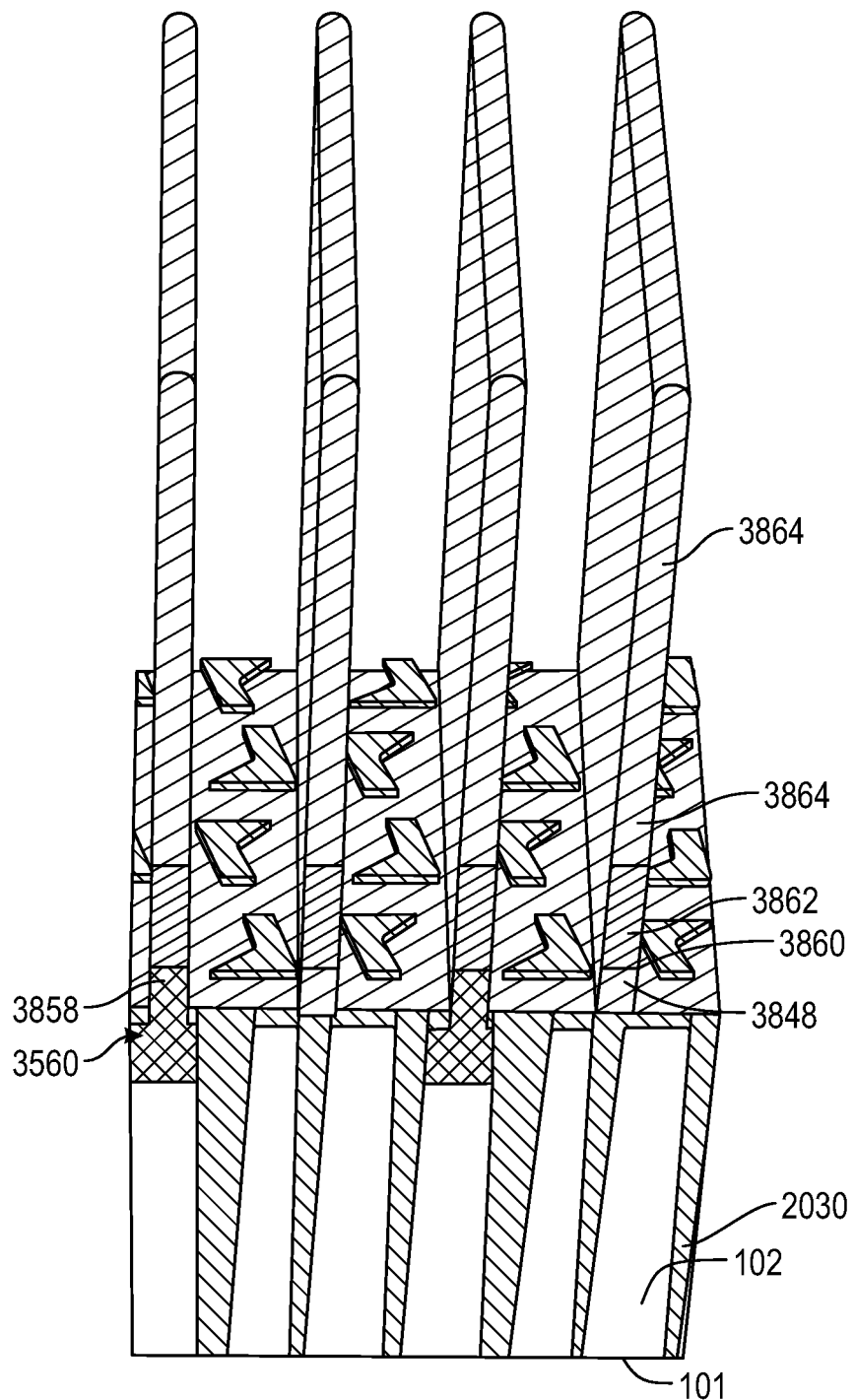
FIG. 38A is a view similar to FIG. 37A, after trimming and pushing the patterned stack according to one embodiment.
Figure 38B:
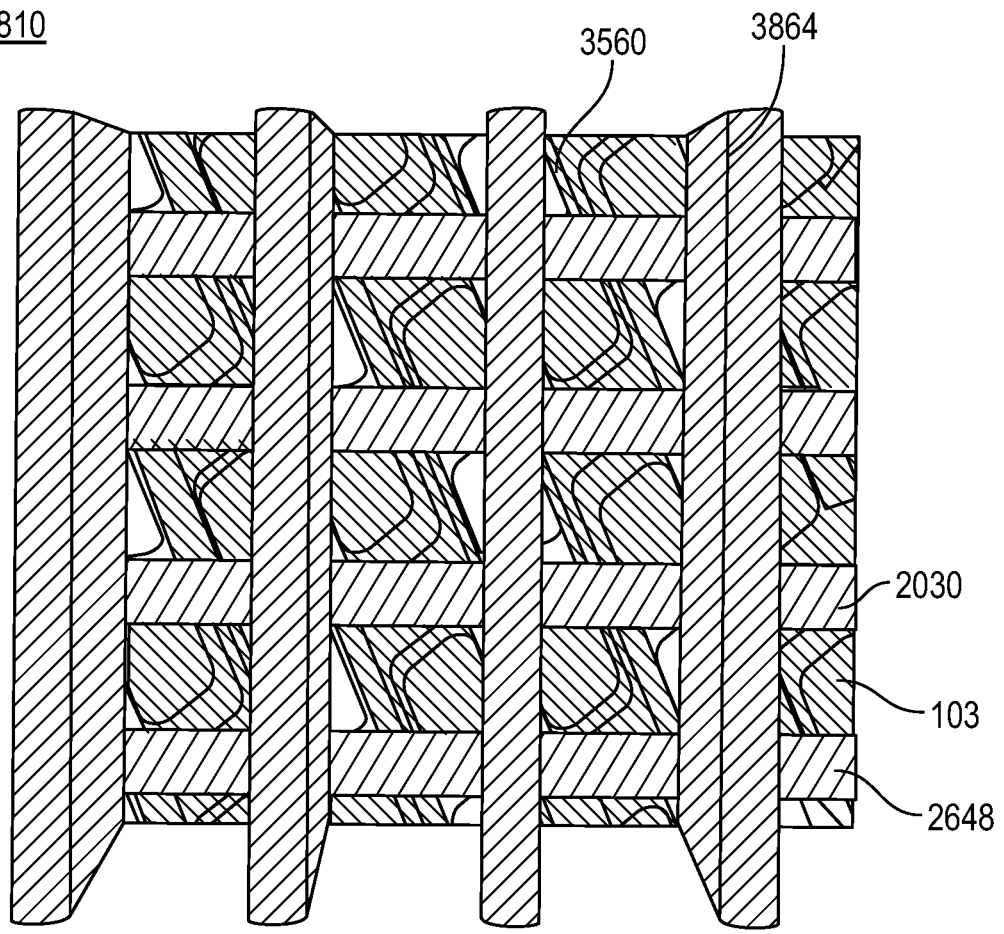
FIG. 38B is a top view of the electronic device structure depicted in FIG. 38A.

FIG. 38A is a view 3800 similar to view 3700 of FIG. 37A and FIG. 38B is a view 3810 similar to view 3710 of FIG. 37B after a trim and push operation to thin the bitline. The process provides a high aspect ratio isotropic etch of four different materials; insulator 3864, bitline metal layer 3862, bitline barrier metal layer 3860 and silicon/polysilicon 3858.

Some embodiments of the disclosure provide methods of forming bit-line-contacts using less than or equal to three, four or five different hardmask materials. Some embodiments provide methods of forming bit-line-contacts using less than or equal to three, four or five different lithography reticles.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. An electronic device comprising:
   a plurality of spaced wordlines defining a third direction, each of the wordlines spaced from adjacent wordlines by a dielectric;
   a plurality of substrate islands within the dielectric between the wordlines, the substrate islands extending in a first direction, second direction and third direction, the substrate islands comprising trapezoid-like shaped islands (TI), right-facing rhombus-like islands (RFI) and left-facing rhombus-like islands (LFI) arranged in repeating patterns along the first direction, the second direction and the third direction, the first direction and the third direction, the islands form a repeating pattern of TI, RFI and LFI, along the second direction, the islands appearing as a line of single type to have a line of TI, a line of RFI and a line of LFI.

2. The electronic device of claim 1, wherein the wordlines comprise one or more of a metal layer, a barrier metal, and a conductive material.

3. The electronic device of claim 2, wherein the metal layer comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), rhodium (Rh), and titanium nitride (TiN).

4. The electronic device of claim 2, wherein the barrier metal comprises one or more of titanium (Ti), titanium nitride (TiN), tantalum nitride (TaN).

5. The electronic device of claim 2, wherein the conductive material comprises a conductive seed layer deposited on a conductive barrier layer.

6. The electronic device of claim 5, wherein the seed layer comprises copper (Cu) and the conductive barrier layer comprises one or more of copper (Cu), aluminum (Al), titanium (Ti), tantalum (Ta), and tantalum nitride (TaN).

7. The electronic device of claim 1, wherein the dielectric comprises one or more of silicon, silicon oxide, silicon nitride, silicon oxynitride, silicon oxycarbide, silicon oxycarbonitride, doped silicon, doped silicon oxide, doped silicon nitride, doped silicon oxynitride, spin-on dielectrics, and a diffusion species growth.

8. The electronic device of claim 1, wherein the electronic device comprises a memory device or a logic device.

9. The electronic device of claim 8, wherein the memory device is a dynamic random access memory device.

* * * * *